(12) United States Patent
Shukla et al.

(10) Patent No.: US 9,445,520 B2
(45) Date of Patent: Sep. 13, 2016

(54) SYSTEMS FOR EJECTING REMOVABLE MODULES FROM ELECTRONIC DEVICES

(71) Applicant: Apple Inc., Cupertino, CA (US)

(72) Inventors: Ashutosh Y. Shukla, Santa Clara, CA (US); Benjamin J. Pope, Sunnyvale, CA (US); Kenneth A. Jenks, Capitola, CA (US); Scott A. Myers, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/317,711

(22) Filed: Jun. 27, 2014

(65) Prior Publication Data

US 2014/0307372 A1    Oct. 16, 2014

Related U.S. Application Data

(63) Continuation of application No. 13/245,687, filed on Sep. 26, 2011, now Pat. No. 8,767,381.

(60) Provisional application No. 61/491,696, filed on May 31, 2011.

(51) Int. Cl.
| | |
|---|---|
| *H05K 7/14* | (2006.01) |
| *G06F 1/16* | (2006.01) |
| *H04B 1/3816* | (2015.01) |
| *H05K 5/02* | (2006.01) |
| *H05K 7/20* | (2006.01) |
| *G06K 13/08* | (2006.01) |
| *F16H 19/00* | (2006.01) |
| *H05K 5/03* | (2006.01) |

(52) U.S. Cl.
CPC .......... *H05K 7/1401* (2013.01); *F16H 19/001* (2013.01); *G06F 1/1658* (2013.01); *G06K 13/0831* (2013.01); *H04B 1/3816* (2013.01); *H05K 5/0295* (2013.01); *H05K 5/03* (2013.01); *H05K 7/2039* (2013.01); *Y10T 74/18992* (2015.01)

(58) Field of Classification Search
CPC ...... H05K 7/1401; H05K 5/025; H05K 5/03; H05K 7/2039; F16H 19/001; G06F 1/1658; G06K 13/0831; H04B 1/3816
See application file for complete search history.

(56) References Cited

U.S. PATENT DOCUMENTS

| | | |
|---|---|---|
| 3,273,417 A | 9/1966 | Sevrence |
| 4,320,749 A | 3/1982 | Highley |
| 4,384,183 A | 5/1983 | Meshoulam |

(Continued)

*Primary Examiner* — Hoa C Nguyen
*Assistant Examiner* — Keith Depew
(74) *Attorney, Agent, or Firm* — Brownstein Hyatt Farber Schreck, LLP

(57) ABSTRACT

An electronic device may be provided with an ejectable component assembly having a connector that can receive and retain a removable module within a housing of the electronic device. The ejectable component assembly may also be provided with an ejector mechanism for at least partially ejecting the removable module from the connector. The ejector mechanism may receive a user input force at an ejector user interface, translate that user input force into an ejection force, and apply that ejection force onto the removable module for ejecting the module. The ejector user interface may be provided at any suitable position of the housing that may not interfere with other functions of the device. The path along which the ejector mechanism translates the user input force into the ejection force between the ejector user interface and the removable module may be provided in any suitable way throughout the device.

20 Claims, 14 Drawing Sheets

(56) References Cited

U.S. PATENT DOCUMENTS

| | | | |
|---|---|---|---|
| 4,843,221 A | 6/1989 | Ohtsuki et al. | |
| 5,115,376 A * | 5/1992 | Nakajima | 361/798 |
| 5,299,580 A * | 4/1994 | Atkinson et al. | 600/585 |
| 5,329,693 A * | 7/1994 | Smith | 29/764 |
| 5,456,610 A | 10/1995 | Banakis et al. | |
| 5,740,012 A * | 4/1998 | Choi | 361/679.39 |
| RE36,511 E * | 1/2000 | Liou et al. | 720/609 |
| 6,027,350 A * | 2/2000 | Chen et al. | 439/159 |
| 6,030,238 A | 2/2000 | Dong | |
| 6,035,216 A * | 3/2000 | Cheng et al. | 455/558 |
| 6,247,947 B1 * | 6/2001 | Knoernschild et al. | 439/159 |
| 6,361,339 B1 * | 3/2002 | Zhang et al. | 439/160 |
| 6,482,020 B1 | 11/2002 | Yeh | |
| 6,814,597 B1 | 11/2004 | Kao | |
| 6,875,034 B1 * | 4/2005 | Su et al. | 439/159 |
| 7,076,581 B2 * | 7/2006 | Cheng | 710/74 |
| 7,355,137 B2 * | 4/2008 | Kawasaki et al. | 200/302.2 |
| 7,449,650 B2 | 11/2008 | Richardson et al. | |
| 7,775,816 B1 | 8/2010 | Huang et al. | |
| 7,820,928 B2 | 10/2010 | Simon | |
| 7,837,092 B2 * | 11/2010 | Wen | 235/375 |
| 8,145,261 B2 * | 3/2012 | Wang et al. | 455/550.1 |
| 8,591,240 B2 * | 11/2013 | Jenks | 439/159 |
| 2004/0185695 A1 * | 9/2004 | Takezawa et al. | 439/159 |
| 2006/0274511 A1 * | 12/2006 | Choi | 361/754 |
| 2008/0170982 A1 * | 7/2008 | Zhang et al. | 423/447.3 |
| 2009/0185045 A1 | 7/2009 | Rosenblatt et al. | |
| 2011/0017011 A1 * | 1/2011 | Beyer et al. | 74/566 |
| 2011/0036696 A1 | 2/2011 | Villain et al. | |
| 2011/0105846 A1 | 5/2011 | Yoshie et al. | |
| 2012/0195013 A1 * | 8/2012 | Trzaskos et al. | 361/754 |

* cited by examiner

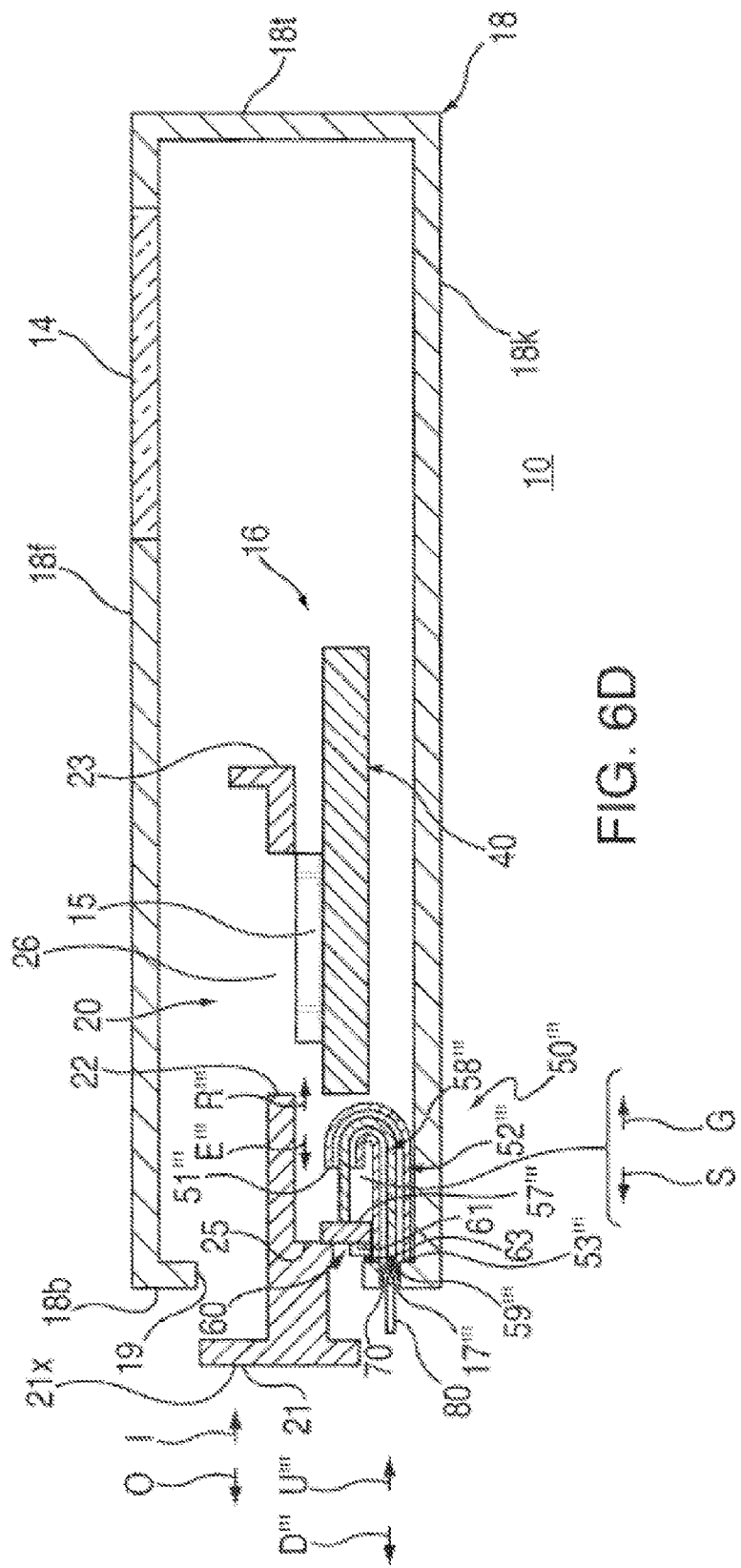

SYSTEMS FOR EJECTING REMOVABLE MODULES FROM ELECTRONIC DEVICES

CROSS-REFERENCE TO RELATED APPLICATION(S)

This application is a continuation of U.S. patent application Ser. No. 13/245,687, filed Sep. 26, 2011 (now U.S. Pat. No. 8,767,381), which claims the benefit of U.S. Provisional Patent Application No. 61/491,696, filed May 31, 2011, both of which are hereby incorporated by reference herein in their entirety.

FIELD OF THE INVENTION

This can relate to systems and methods for ejecting removable modules from electronic devices.

BACKGROUND OF THE DISCLOSURE

To enhance the use of electronic devices (e.g., cellular telephones), ejectable component assemblies may be used to couple removable modules (e.g., subscriber identity module ("SIM") cards) to electrical components of the electronic devices. Some known ejectable component assemblies include a tray for receiving a removable module, and a connector within a housing of the device for receiving the tray as it is inserted through an opening in the housing. The connector may retain the tray such that contacts of the module may be electrically coupled to a circuit board or other electrical component of the device.

Some known ejectable component assemblies also include an ejector mechanism for ejecting the tray from the connector and, thus, from the housing of the device. Such an ejector mechanism often takes up valuable real estate within the housing of the device. Moreover, a portion of such an ejector mechanism often requires a user to interact with an ejector user interface positioned through an opening in the housing that is the same as or close to the housing opening through which the tray is ejected. Such an ejector mechanism interface can interfere with the function of the ejectable component assembly.

SUMMARY OF THE DISCLOSURE

Systems and methods for ejecting removable modules from electronic devices are provided.

For example, in some embodiments, there is provided an ejectable component assembly that may include any suitable assembly operative to insert into an electronic device, retain within the electronic device, and/or eject from the electronic device a removable module, such as a subscriber identity module ("SIM") card. The ejectable component assembly can include a tray that may hold the removable module, and a connector within the electronic device that may receive, retain, and release the tray and module. Moreover, the ejectable component assembly may include an ejector mechanism for at least partially ejecting the tray and module from the connector.

The ejector mechanism may receive a user input force at an ejector user interface through a housing of the electronic device, translate that user input force into an ejection force, and apply that ejection force onto the tray and/or module for ejecting the tray and/or module. The ejector user interface may be provided at any suitable position of the housing that may not interfere with other functions of the device.

The path along which the ejector mechanism may translate the user input force into the ejection force between the ejector user interface and the tray and/or module may be provided in any suitable way throughout the device. The direction of the user input force received by the ejector mechanism and the direction of the ejection force applied by the ejector mechanism may be linear, parallel, perpendicular, or skew, or may have any other suitable relationship with one another.

In some embodiments, there is provided an electronic device that includes a housing, a connector positioned within the housing, and an ejector mechanism having a guide and a core. The core may include a first end that may be configured to receive a user input force through an ejector user interface at a first portion of the housing. The core may be configured to move along at least a portion of the guide from a first core position to a second core position in response to the received user input force. The core may also include a second end of the core that may be configured to apply an ejection force onto a removable entity for at least partially ejecting the removable entity from the connector in response to the movement of the core from the first core position to the second core position.

In some other embodiments, there is provided an electronic device that includes a housing, a connector positioned within the housing, and an ejector mechanism that may include a guide and a core. The core may be configured to receive a user input force at a first end of the core through an ejector user interface at a first portion of the housing. The core may also be configured to translate the user input force into an ejection force at a second end of the core. The second end of the core may be configured to apply the ejection force onto a removable entity for at least partially ejecting the removable entity from the connector and through an entity housing opening at a second portion of the housing. The guide may be configured to regulate at least a portion of the path along which the core translates the user input force into the ejection force.

In yet some other embodiments, there is provided an ejector mechanism for ejecting a removable entity from a connector. The ejector mechanism may include a core that may be configured to receive a user input force at a first end of the core, and that may be configured to translate the user input force into an ejection force at a second end of the core for application onto the removable entity. The ejector mechanism may also include a guide that may be configured to regulate at least a portion of the path along which the core translates the user input force into the ejection force. The at least a portion of the path may not be linear.

BRIEF DESCRIPTION OF THE DRAWINGS

The above and other aspects of the invention, its nature, and various features will become more apparent upon consideration of the following detailed description, taken in conjunction with the accompanying drawings, in which like reference characters may refer to like parts throughout, and in which:

FIG. 6D is a cross-sectional view of the electronic device of FIGS. 1-6C, taken from line VID-VID of FIG. 5, in accordance with some embodiments of the invention;

DETAILED DESCRIPTION OF THE DISCLOSURE

Systems and methods for ejecting removable modules from electronic devices are provided and described with reference to FIGS. 1-10.

The following discussion describes various embodiments of an electronic device that may include at least one ejectable component assembly. The term "electronic device" can include, but is not limited to, music players, video players, still image players, game players, other media players, music recorders, video recorders, cameras, other media recorders, radios, medical equipment, calculators, cellular telephones, other wireless communication devices, personal digital assistants, remote controls, pagers, laptop computers, desktop computers, tablets, servers, printers, or combinations thereof. In some cases, the electronic device may perform a single function (e.g., an electronic device dedicated to playing music) and in other cases, the electronic device may perform several functions (e.g., an electronic device that plays music, displays video, stores pictures, and receives and transmits telephone calls).

The electronic device may generally be any portable, mobile, hand-held, or miniature electronic device so as to allow a user, for example, to listen to music, play games, record videos, take pictures, and/or conduct communications operations (e.g., telephone calls) wherever he or she travels. Some miniature electronic devices may have a form factor that is smaller than that of hand-held electronic devices, such as an iPod™ available by Apple Inc. of Cupertino, Calif. Illustrative miniature electronic devices can be integrated into various objects that include, but are not limited to, watches, rings, necklaces, belts, accessories for belts, headsets, accessories for shoes, virtual reality devices, other wearable electronics, accessories for sporting equipment, accessories for fitness equipment, key chains, or any combination thereof. Alternatively, electronic devices that incorporate an ejectable component assembly may not be portable at all.

Figure 1:
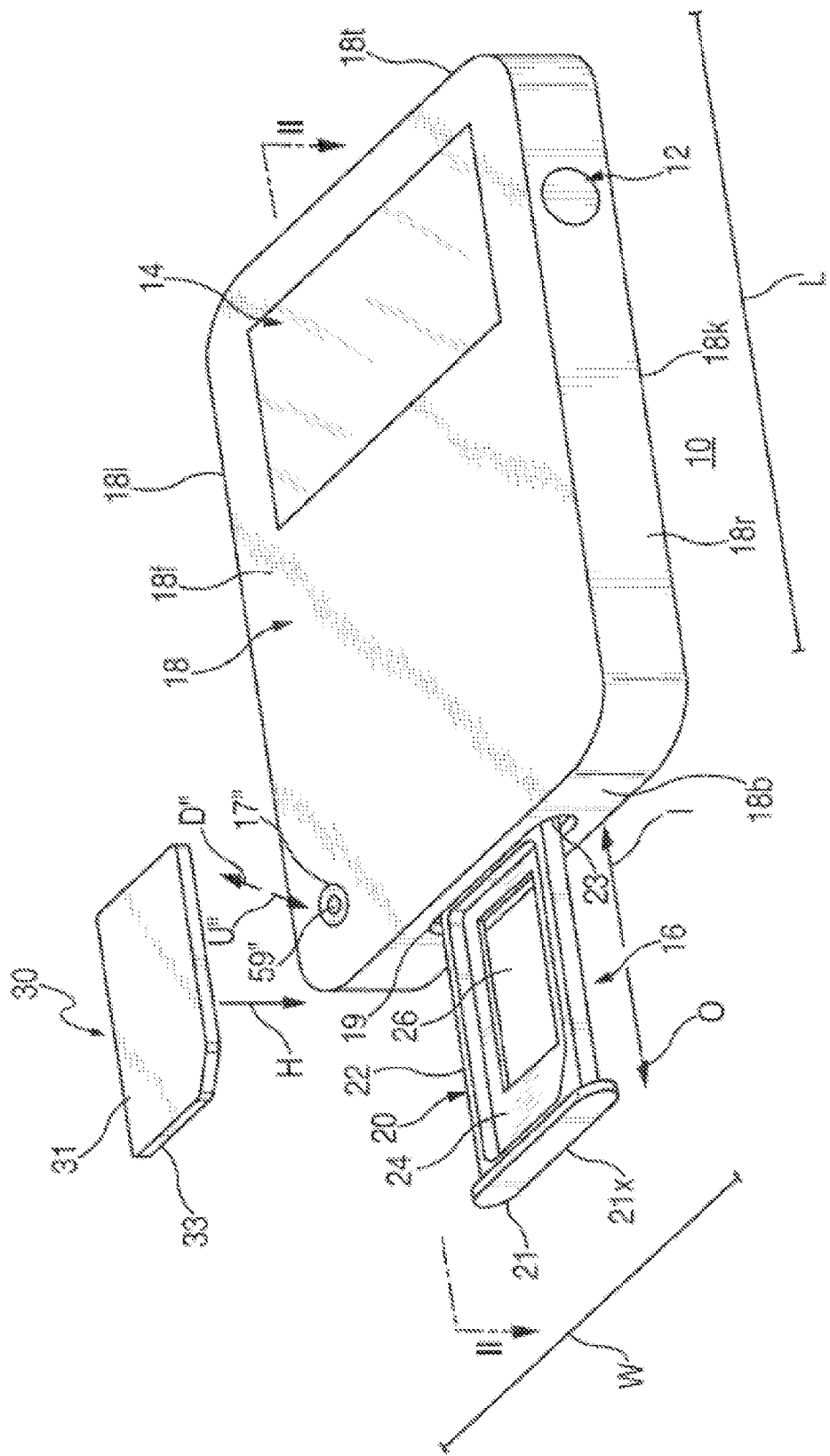
FIG. 1 is a perspective view of an exemplary electronic device including an ejectable component assembly in a first stage of actuation, in accordance with some embodiments of the invention.
Figure 2:
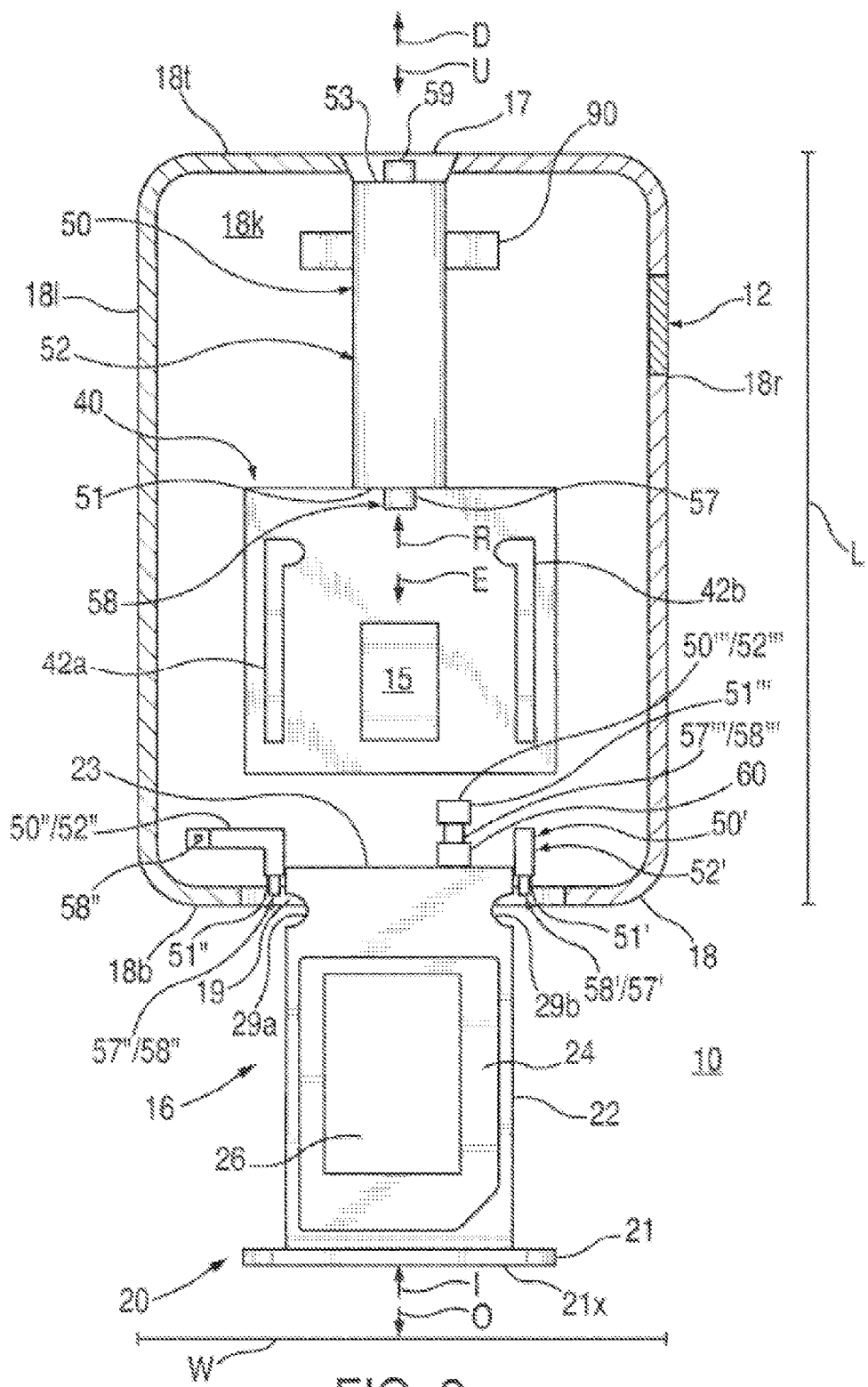
FIG. 2 is an elevational view of a portion of the electronic device of FIG. 1, taken from line II-II of FIG. 1.

FIG. 1 is a perspective view of an illustrative electronic device 10 that may include an ejectable component assembly in accordance with some embodiments of the invention. Electronic device 10 can include at least one user input component assembly 12 that may allow a user to interface with device 10, at least one device output component assembly 14 that may provide the user with device generated information, at least one ejectable component assembly 16 that may allow a user to insert and eject a removable module into and from device 10, and a protective housing 18 that may at least partially enclose one or more of the input, output, and ejectable component assemblies of device 10. Housing 18 may be any suitable shape and may include any suitable number of walls. In some embodiments, as shown in FIG. 1, for example, housing 18 may be of a generally hexahedral shape and may include a top wall 18*t*, a bottom wall 18*b* that may be opposite top wall 18*t*, a left wall 18l, a right wall 18*r* that may be opposite left wall 18l, a front wall 18*f*, and a back wall 18*k* that may be opposite front wall 18*f*.

Component assemblies 12 and 14 can include any type of component assembly operative to receive and/or transmit digital and/or analog data (e.g., audio data, video data, other types of data, or a combination thereof). Input component assembly 12 may include any suitable input mechanism, such as, for example, one or more sliding switches, buttons, keypads, track balls, joysticks, dials, scroll wheels, touch screen displays, electronics for accepting audio and/or visual information, antennas, infrared ports, or combinations thereof. Output component assembly 14 may include any suitable output mechanism, such as, for example, one or more audio speakers, headphones, audio line-outs, visual displays, antennas, infrared ports, rumblers, vibrators, or combinations thereof. It should be noted that one or more input component assemblies 12 and one or more output component assemblies 14 may sometimes be referred to collectively herein as an input/output ("I/O") interface. It should also be noted that input component assembly 12 and output component assembly 14 may sometimes be a single I/O component, such as a touch screen that may receive input information through a user's touch of a display screen and that may also provide visual information to a user via that same display screen.

Ejectable component assembly 16 may include any suitable assembly that may be operative to insert into device 10, retain within device 10, and/or eject from device 10 a removable module 30. Removable module 30 may include, for example, any suitable type of integrated circuit card ("ICC"), chip card, memory card, flash memory card, microprocessor card, smart card, such as a subscriber identity module ("SIM") card (e.g., a mini-SIM card or a micro-SIM card), or combinations thereof. In some embodiments, removable module 30 may contain electronic circuitry (e.g., on the bottom of module 30 (not shown)), from which electronic device 10 may read data and/or to which electronic device 10 may write data.

Ejectable component assembly 16 can include a module tray 20 that may be at least partially insertable into (e.g., in the direction of arrow I) and ejectable from (e.g., in the direction of arrow O) device 10 via a module housing opening 19 through housing 18. Module housing opening 19 may be formed through any suitable portion of housing 18 for providing tray 20 and/or module 30 access into housing 18 of device 10. For example, as shown in FIG. 1, module housing opening 19 may be provided through bottom wall 18b of housing 18. It is to be noted that, although module housing opening 19 is shown in FIG. 1 to be provided through bottom wall 18b that may define a width W of housing 18, module housing opening 19 may be provided through any wall portion of housing 18. For example, in some embodiments, module housing opening 19 may be provided through right wall 18r that may define a length L of housing 18, which may be longer than width W of housing 18.

Tray 20 of ejectable component assembly 16 may include a body portion 22 extending between a first tray end 21 and a second tray end 23. Tray 20 may include an outer surface 21x at first tray end 21 that may provide a cosmetic surface for device 10 when tray 20 is inserted into device 10. In some embodiments, outer surface 21x of tray 20 may be fashioned to be aesthetically pleasing to a user of device 10, for example, by matching the color and/or material of surface 21x with that of the exterior surface of housing 18 about module housing opening 19. First tray end 21, second tray end 23, and/or body portion 22 may define the periphery and/or walls of a module holder 24 of tray 20. Module holder 24 may be operative to receive and hold removable module 30 with respect to tray 20 (e.g., when module 30 is inserted into holder 24 in the direction of arrow H). More particularly, module holder 24 may be operative to receive and hold removable module 30 with respect to an opening 26 that may be provided through a portion of tray 20. Electronic circuitry of module 30 may align with opening 26 when module 30 is held by tray 20.

Tray 20 may be formed as a single unitary component from any suitable material, such as plastic, glass, metal, ceramic materials, epoxies, composite materials, or the like. Moreover, tray 20 may be a single unitary component made by any suitable process, such as casting, molding, forming, forging, machining, extruding, and the like. Alternatively, tray 20 may be formed by joining at least two distinct tray portions. Holder 24 can be sized and shaped to substantially match the size and shape of module 30, such that module 30 can be snap-fitted or otherwise releasably retained by holder 24, and such that a portion of module 30 may be exposed through opening 26 of tray 20.

As mentioned, tray 20 may be configured to receive and retain any suitable module 30 for insertion into device 10, such as an integrated circuit card, chip card, memory card, flash memory card, microprocessor card, smart card, such as a SIM card, and the like. As shown in FIG. 1, for example, module 30 may include a top surface 31 and a bottom surface 33. One or more electrical contacts (not shown) of module 30 may be exposed along bottom surface 33 of module 30. Therefore, when module 30 is inserted into module holder 24 in the direction of arrow H, at least a portion of some or all of the electrical contacts on bottom surface 33 of module 30 may be exposed through opening 26 of tray 20. For example, opening 26 may allow electrical circuitry of electronic device 10 to access data from one or more electrical contacts of module 30 through opening 26 when tray 20 and module 30 are partially or fully inserted into device 10 through module housing opening 19.

Once module 30 has been loaded into holder 24, tray 20 may be inserted into a connector that is at least partially internal to housing 18 of device 10. For example, as shown in FIGS. 2-6F, ejectable component assembly 16 may also include a connector 40 for receiving and holding removable tray 20 at least partially within housing 18 of device 10 such that opening 26 of tray 20 may align with a module reader/writer of device 10. For example, opening 26 of tray 20 may align with module reader/writer coupling circuitry 15 of device 10 when tray 20 is retained by connector 40, such that one or more electrical contacts of module 30 may be electrically coupled to coupling circuitry 15 through opening 26 when module 30 is held by tray 20.

Figure 3:
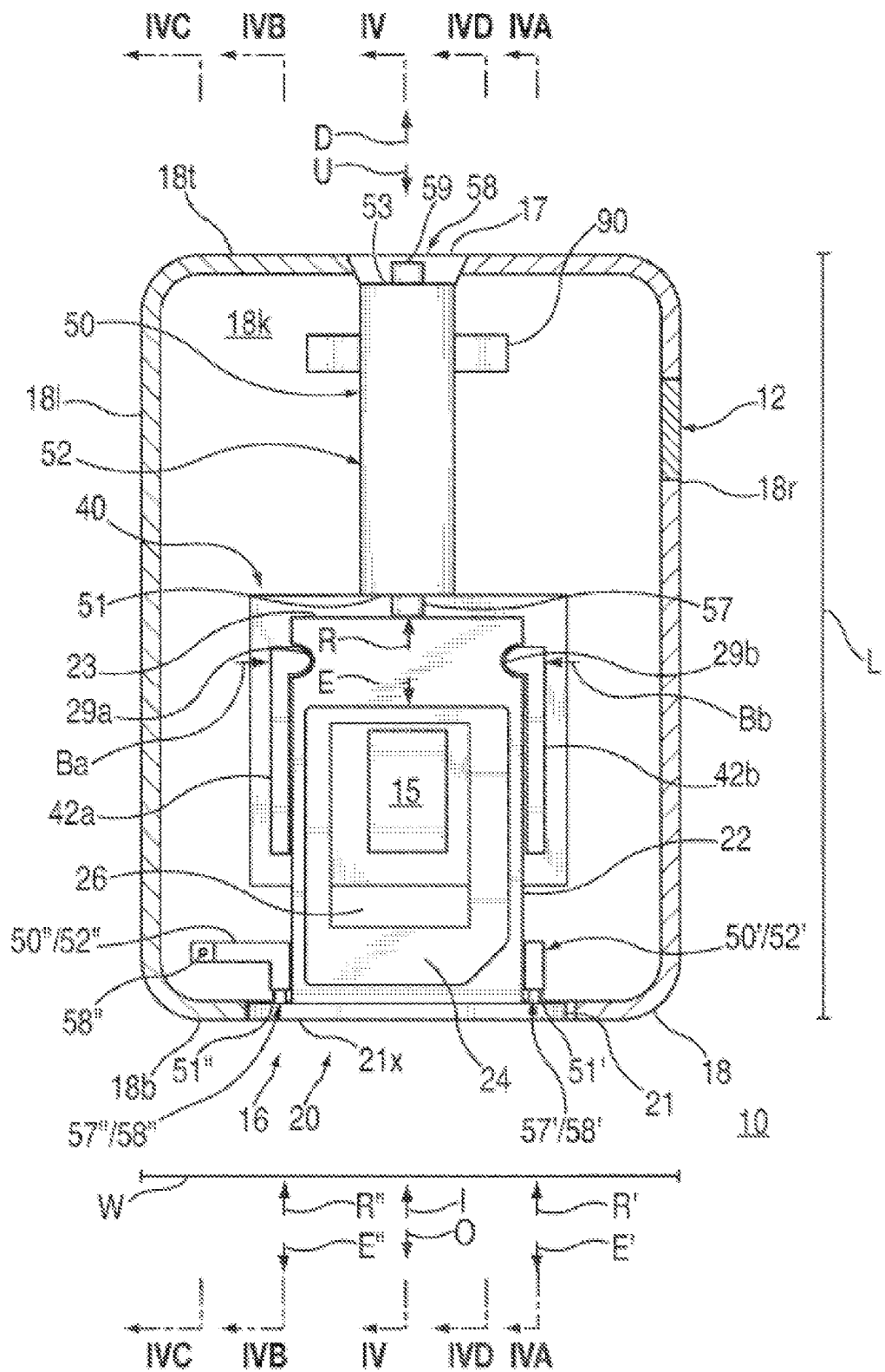
FIG. 3 is an elevational view of a portion of the electronic device of FIGS. 1 and 2, similar to FIG. 2, but with the ejectable component assembly in a second stage of actuation, in accordance with some embodiments of the invention.

Connector 40 may be coupled to device 10 (e.g., by surface mount technology ("SMT")) such that, when tray 20 is inserted into device 10 through opening 19 of housing 18 in the direction of arrow I, connector 40 may receive, guide, and/or retain tray 20 such that one or more electrical contacts of module 30 held by tray 20 may align with coupling circuitry 15 of device 10 through opening 26 of tray 20. Although portions of housing 18 about opening 19 may at least initially guide the insertion of end 23 of tray 20 through opening 19 in the direction of arrow I, connector 40 can include retention members 42a and 42b for guiding tray 20 in the direction of arrow I once tray 20 has been at least partially inserted through opening 19. Retention members 42a and 42b of connector 40 may interact with tray 20 to retain tray 20 in a functional position with respect to coupling circuitry 15 of device 10 (e.g., the fully loaded position of tray 20 shown in FIGS. 3-4D), such that one or more electrical contacts of module 30 may align with coupling circuitry 15 of device 10 through opening 26 of tray 20. For example, retention members 42a and 42b can retain a portion of tray 20 therebetween by exerting a biasing force of members 42a and 42b on that portion of tray 20. As shown in FIG. 3, for example, retention members 42a and 42b can contact and exert their respective biasing connector forces (e.g., in the direction of arrows Ba and Bb) on tray 20 within respective grooved or notched portions 29a and 29b of tray 20. It is to be understood, however, that connector 40 may be configured to receive, guide, and/or retain tray 20 and/or module 30 in any other suitable way using any other type of connector force or collection of connector forces on any suitable portion or portions of tray 20 and/or module 30.

Surface 21*x* of tray end 21 of tray 20 can be any suitable shape such that it can be substantially flush with the portions of housing 18 about opening 19 when tray 20 is held in its functional or fully loaded position by connector 40, thereby creating a smooth profile for that portion of device 10. For example, as shown in FIGS. 1-6F, the external surface of housing 18 about opening 19 may be substantially straight and flat, and, therefore, so can be surface 21*x* of tray 20. Alternatively, however, the surface of housing 18 about opening 19 may be substantially curved, and, therefore, so can be surface 21*x* of tray 20. A curvature of surface 21*x* can be continuous with a curvature of housing 18 about opening 19 so as to create a smooth profile for that portion of device 10.

With continued reference to FIGS. 2-4, 5, and 6, ejectable component assembly 16 can also include an ejector mechanism 50 for ejecting tray 20 from connector 40. Ejector mechanism 50 may include a guide 52 and a core 58. Guide 52 may be any suitable component or collection of components that may be capable of regulating at least a portion of the path along which a first force applied to a first end of core 58 may be translated into a second force at a second end of core 58. For example, guide 52 may extend between a first guide end 51 and a second guide end 53. Guide 52 may be linear or any other suitable geometry, such as curved, angled, or multi-planar, when extending between first guide end 51 and second guide end 53. In some embodiments, guide 52 may be a hollow tube extending between a first opening at first guide end 51 and a second opening at second guide end 53. Guide 52 may be made of any suitable material, such as rubber, plastic, metal, or any combinations thereof. Different portions of guide 52 may be flexible or rigid. Guide 52 may be a unitary component or may include multiple segmented components.

Core 58 may be any suitable component or collection of components that may be capable of translating a first force applied to a first end of core 58 into a second force at a second end of core 58. For example, core 58 may extend between a first core end 57 and a second core end 59. Core 58 may be configured to translate a received force applied to first core end 57 into a translated force at second core end 59 and/or to translate a received force applied to second core end 59 into a translated force at first core end 57. At least a portion of core 58 between first core end 57 and second core end 59 may be positioned within at least a portion of guide 52 between first guide end 51 and second guide end 53. In some embodiments, core 58 may be a single component made of any suitable material, such as twisted ribbon, woven steel film, polytetrafluoroethylene ("PTFE"), plastic, or any combination thereof. Different portions of core 58 may be flexible or rigid. For example, a portion of core 58 that may move along a curved or otherwise non-linear portion of guide 52 may be flexible, while another portion of core 58 may be rigid. Core 58 may be a unitary component or may include multiple segmented components.

Figure 4:
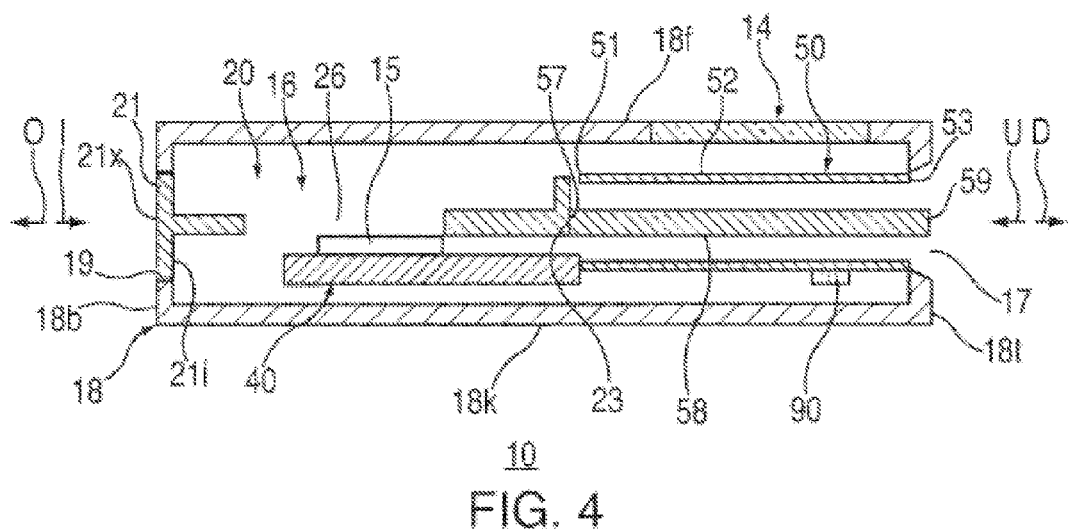
FIG. 4 is a cross-sectional view of the electronic device of FIGS. 1-3, taken from line IV-IV of FIG. 3, in accordance with some embodiments of the invention.

When tray 20 is held in its functional or fully loaded position by connector 40, as shown in FIGS. 3 and 4, for example, first guide end 51 of guide 52 may be positioned within housing 18 of device 10 proximate to a portion of tray 20 such that the path of first core end 57 of core 58 may extend out beyond first guide end 51 of guide 52 to interact with tray 20. When core 58 translates a received force applied to second core end 59 into a translated force at first core end 57, first core end 57 may interact with tray 20 by applying that translated force onto tray 20. For example, when tray 20 is held in its functional or fully loaded position by connector 40, as shown in FIGS. 3 and 4, first guide end 51 of guide 52 may be positioned adjacent to second tray end 23 of tray 20, such that the path of first core end 57 of core 58 may extend out beyond first guide end 51 of guide 52 to interact with second tray end 23. When core 58 translates a received force applied to second core end 59 (e.g., in the direction of arrow U) into a translated force at first core end 57 (e.g., in the direction of arrow E), first core end 57 may interact with tray 20 by applying that translated force onto tray 20 at second tray end 23.

A user of device 10 may eject tray 20 from connector 40 using ejector mechanism 50 when tray 20 is held in its functional or fully loaded position by connector 40. For example, as shown in FIGS. 3 and 4, a user may apply a user input force in the direction of arrow U onto second core end 59. Core 58 may be configured to translate this received user input force at second core end 59 into a translated force in the direction of arrow E at first core end 57, and first core end 57 may apply this translated force in the direction of arrow E onto tray end 23 of tray 20 for at least partially ejecting tray 20 from connector 40 in the direction of arrow O (e.g., from the fully loaded tray position of FIGS. 3 and 4 to the at least partially ejected tray position of FIGS. 5 and 6).

Ejector mechanism 50 may be configured to translate a received user input force at second core end 59 into a translated force at first core end 57 that may be great enough to overcome a retention force applied by connector 40 on tray 20 for at least partially ejecting tray 20 from connector 40. For example, ejector mechanism 50 may be configured to translate a received user input force in the direction of arrow U at second core end 59 into a translated force in the direction of arrow E at first core end 57 that may be applied to end 23 of tray 20 when tray 20 is held in its functional or fully loaded position by connector 40. This translated force that may be applied by first core end 57 to tray 20 in the direction of arrow E may be great enough to overcome a retention force applied by retention members 42*a* and 42*b* on tray 20 (e.g., in the direction of arrows Ba and Bb), such that tray 20 may be at least partially ejected from connector 40 in the direction of arrow O (e.g., from the fully loaded tray position of FIGS. 3 and 4 to the at least partially ejected tray position of FIGS. 5 and 6).

Such that a user of device 10 may eject tray 20 from connector 40 using ejector mechanism 50 (e.g., when tray 20 is held in its functional or fully loaded position by connector 40, as shown in FIGS. 3 and 4, for example), second core end 59 of core 58 may be accessible to a user at an ejector user interface 17. Ejector user interface 17 may be an opening provided through any suitable portion of housing 18 for providing a user external to housing 18 with the ability to apply a user input force in the direction of arrow U onto second core end 59. For example, as shown in FIGS. 3, 4, 5, and 6, ejector user interface 17 may be provided through top wall 18*t* of housing 18. It is to be noted that, although ejector user interface 17 is shown in FIGS. 3, 4, 5, and 6 to be provided through top wall 18*t* that may be opposite to bottom wall 18*b* through which module housing opening 19 is provided, ejector user interface 17 may be provided through the same wall as module housing opening 19 or through any wall of housing 18 having any geometrical or spatial relationship with the wall of housing 18 through which module housing opening 19 is provided. For example, in other embodiments, ejector user interface 17 may be provided through any one of bottom wall 18*b*, front wall 18*f*, back wall 18*k*, left wall 18*l*, and right wall 18*r* when module housing opening 19 is provided through bottom wall 18*b*.

When tray 20 is held in its functional or fully loaded position by connector 40, as shown in FIGS. 3 and 4, second core end 59 of core 58 may be positioned such that it is at least slightly recessed within ejector user interface 17 from the external surface of top wall 18t (e.g., in the direction of arrow U). In other embodiments, when tray 20 is held in its functional or fully loaded position by connector 40, second core end 59 of core 58 may be positioned such that it is flush with the external surface of top wall 18t about ejector user interface 17. In yet other embodiments, when tray 20 is held in its functional or fully loaded position by connector 40, second core end 59 of core 58 may be positioned such that it extends out of housing 18 through ejector user interface 17 beyond the external surface of top wall 18t (e.g., in the direction of arrow D). Similarly, when tray 20 is held in its functional or fully loaded position by connector 40, second guide end 53 of guide 52 may be positioned at least slightly recessed within ejector user interface 17 from the external surface of top wall 18t, flush with the external surface of top wall 18t about ejector user interface 17, out of housing 18 through ejector user interface 17 beyond the external surface of top wall 18t, or in any other suitable position such that guide 52 may be capable of regulating at least a portion of the path along which one force applied to one end of core 58 may be translated into another force at another end of core 58.

Figure 5:
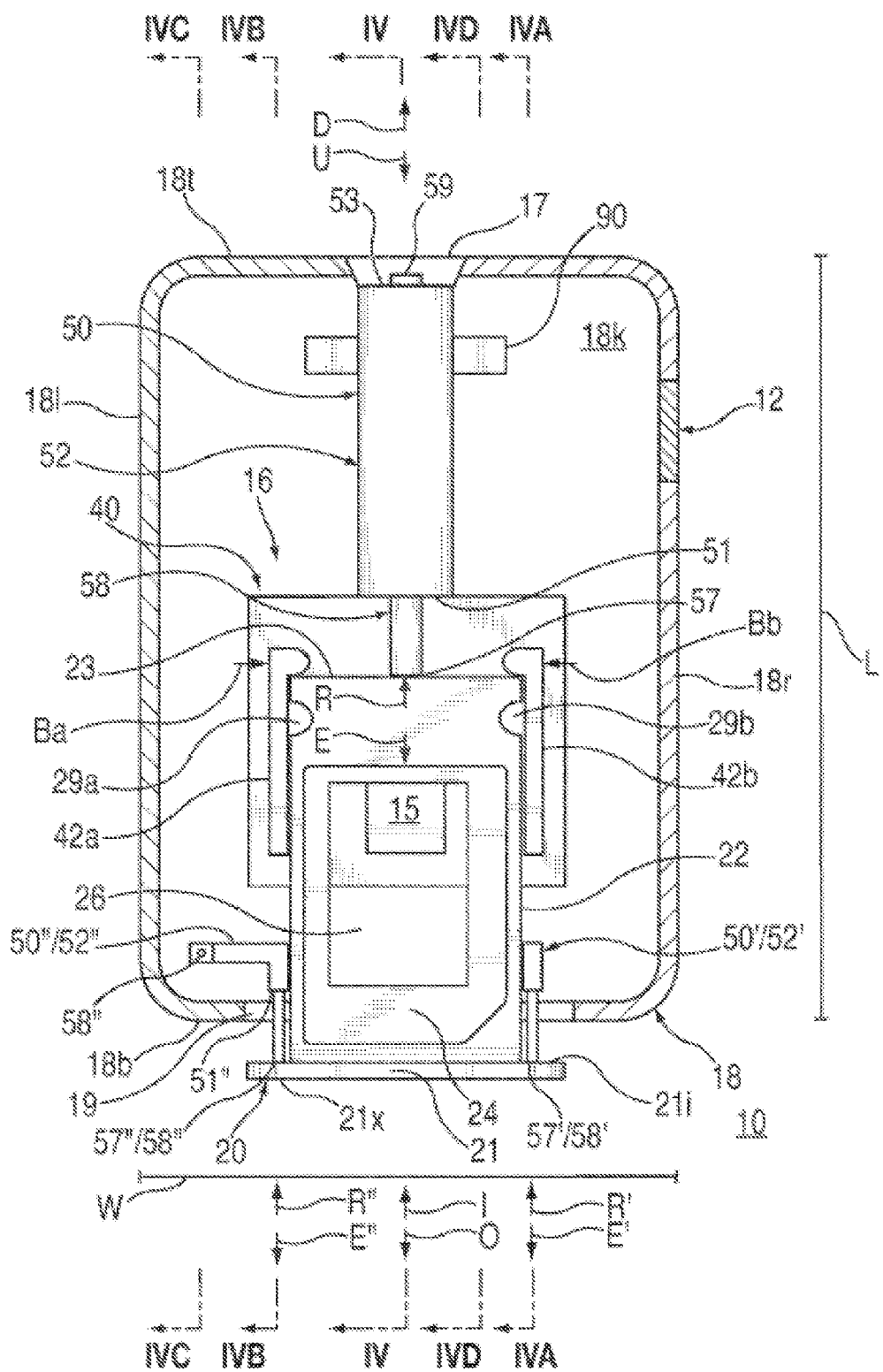
FIG. 5 is an elevational view of a portion of the electronic device of FIGS. 1-4D, similar to FIGS. 2 and 3, but with the ejectable component assembly in a third stage of actuation, in accordance with some embodiments of the invention.
Figure 6:
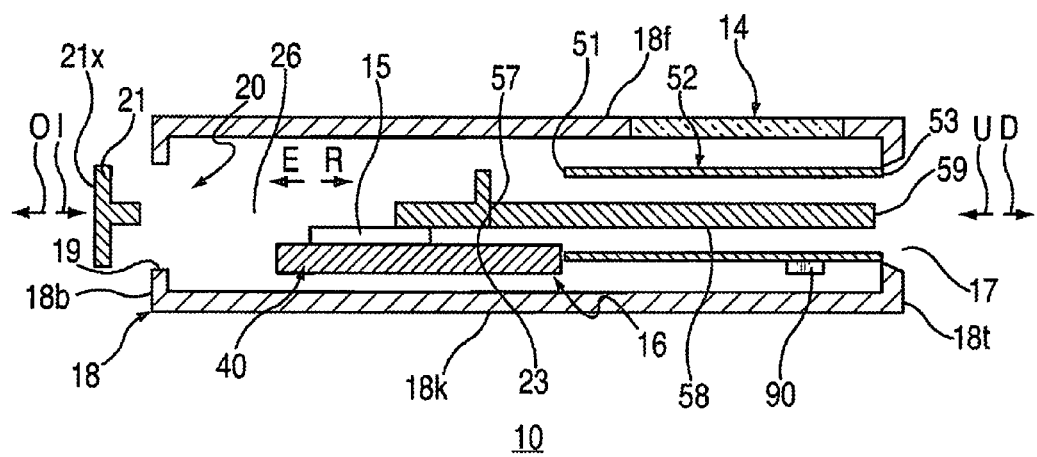
FIG. 6 is a cross-sectional view of the electronic device of FIGS. 1-5, taken from line VI-VI of FIG. 5, in accordance with some embodiments of the invention.

When a user of device 10 inserts tray 20 into its functional or fully loaded position within connector 40, the insertion force applied by the user onto tray 20 may be translated by tray 20 into a retraction force that may be applied to first core end 57 for translating core 58 to a core position that may be utilized to eject tray 20. For example, as shown in FIGS. 5 and 6, a user may apply a tray insertion force in the direction of arrow I onto first tray end 21 of tray 20 for inserting tray 20 into connector 40. For example, a user may apply a tray insertion force in the direction of arrow I onto first tray end 21 of tray 20 such that connector 40 may receive and retain tray 20 in a functional or fully loaded position with respect to coupling circuitry 15 of device 10 (e.g., the position of tray 20 as shown in FIGS. 3 and 4). Tray 20 (e.g., in conjunction with any interaction with connector 40) may be configured to translate this received tray insertion force in the direction of arrow I at first tray end 21 into a core retraction force in the direction of arrow R at second tray end 23 of tray 20 for retracting core 58 to a core position that may be utilized to eject tray 20 from connector 40.

For example, tray 20 may be configured to translate a received tray insertion force in the direction of arrow I at first tray end 21 into a core retraction force in the direction of arrow R at second tray end 23 that may be applied to first core end 57 of core 58. This retraction force that may be applied by second tray end 23 onto first core end 57 in the direction of arrow R may be translated by core 58 to apply a device return force in the direction of arrow D onto second core end 59. For example, the retraction force that may be applied by second tray end 23 onto first core end 57 in the direction of arrow R during insertion of tray 20 into connector 40 may be translated by core 58 to apply a device return force in the direction of arrow D onto second core end 59 such that core 58 may move from a first position to a second position (e.g., from the core position of FIGS. 5 and 6 when tray 20 is at least partially ejected from connector 40 to the core position of FIGS. 3 and 4 when tray 20 is fully loaded and retained by connector 40).

The relative directions of various forces applied to ejector mechanism 50 and applied by ejector mechanism 50 may vary in any suitable way. As mentioned, when tray 20 is held in its functional or fully loaded position by connector 40, ejector mechanism 50 may be in a retracted position, as shown in FIGS. 3 and 4. When in such a retracted position, ejector mechanism 50 may be configured to translate a received user input force in the direction of arrow U at second core end 59 into a translated force in the direction of arrow E at first core end 57 that may be applied to second tray end 23. This translated force that may be applied by first core end 57 to tray 20 in the direction of arrow E may be great enough to overcome a retention force applied by connector 40 on tray 20, such that tray 20 may be at least partially ejected from connector 40 in the direction of arrow O (e.g., from the fully loaded tray position of FIGS. 3 and 4 to the at least partially ejected tray position of FIGS. 5 and 6).

Therefore, the direction of arrow U in which a user input force may be applied to ejector mechanism 50 can have any suitable relationship with respect to the direction of arrow E in which a translated force may be applied by ejector mechanism 50 onto tray 20. Although the direction of arrow U and the direction of arrow E are shown in FIGS. 3, 4, 5, and 6 to be linear and in the same direction, ejector mechanism 50 may be configured in any suitable way such that the direction in which a user input force is applied to ejector mechanism 50 may have any other suitable relationship with respect to the direction in which a translated force is applied by ejector mechanism 50 onto tray 20. For example, in other embodiments, ejector mechanism 50 may be configured such that the direction in which a user input force is applied to ejector mechanism 50 may have any other suitable relationship with respect to the direction in which a translated force is applied by ejector mechanism 50 onto tray 20, including, but not limited to, perpendicular, skew, linear in opposite directions, and the like.

Similarly, the direction of arrow E in which a translated force may be applied by ejector mechanism 50 onto tray 20 can have any suitable relationship with respect to the direction of arrow O in which tray 20 may be ejected from connector 40. Although the direction of arrow E and the direction of arrow O are shown in FIGS. 3, 4, 5, and 6 to be linear and in the same direction, ejectable component assembly 16 may be configured in any suitable way such that the direction in which a translated force is applied by ejector mechanism 50 onto tray 20 may have any other suitable relationship with respect to the direction in which tray 20 is ejected from connector 40.

As also mentioned, when tray 20 is not yet held in its functional or fully loaded position by connector 40, tray 20 and ejector mechanism 50 may each be in an ejected position, as shown in FIGS. 5 and 6. When in such an ejected position, tray 20 may be configured to translate a received tray insertion force in the direction of arrow I at first tray end 21 into a core retraction force in the direction of arrow R at second tray end 23 that may be applied to first core end 57 of core 58. This retraction force that may be applied by second tray end 23 onto first core end 57 in the direction of arrow R may be translated by core 58 to apply a device return force in the direction of arrow D onto second core end 59, such that core 58 of ejector mechanism 50 may move from a first position to a second position (e.g., from the ejected position of ejector mechanism 50 of FIGS. 5 and 6 when tray 20 is at least partially ejected from connector 40 to the retracted position of ejector mechanism 50 of FIGS. 3 and 4 when tray 20 is fully loaded and retained by connector 40).

Therefore, the direction of arrow I in which a tray insertion force may be applied to first tray end 21 can have any suitable relationship with respect to the direction of arrow R in which a core retraction force may be applied by second tray end 23 onto ejector mechanism 50. Although the direction of arrow I and the direction of arrow R are shown in FIGS. 3, 4, 5, and 6 to be linear and in the same direction, ejectable component assembly 16 may be configured in any suitable way such that the direction in which a tray insertion force is applied to tray 20 may have any other suitable relationship with respect to the direction in which a core retraction force is applied by tray 20 onto ejector mechanism 50.

Similarly, the direction of arrow R in which a core retraction force may be applied by tray 20 onto ejector mechanism 50 can have any suitable relationship with respect to the direction of arrow D in which ejector mechanism 50 may translate a device return force onto second core end 59. Although the direction of arrow R and the direction of arrow D are shown in FIGS. 3, 4, 5, and 6 to be linear and in the same direction, ejector mechanism 50 may be configured in any suitable way such that the direction in which a core retraction force is applied by tray 20 onto ejector mechanism 50 may have any other suitable relationship with respect to the direction in which ejector mechanism 50 may translate a device return force onto second core end 59. For example, in other embodiments, ejector mechanism 50 may be configured such that the direction in which a core retraction force is applied by tray 20 onto ejector mechanism 50 may have any other suitable relationship with respect to the direction in which ejector mechanism 50 may translate a device return force onto second core end 59, including, but not limited to, perpendicular, skew, linear in opposite directions, and the like.

The relative directions of various forces applied to and applied by an ejector mechanism of ejectable component assembly 16 may vary in any suitable way from those relative directions of ejector mechanism 50. For example, as shown in FIGS. 2, 3, 4A, 5, and 6A, ejectable component assembly 16 may include an ejector mechanism 50' in addition to or as an alternative to ejector mechanism 50. Ejector mechanism 50' may include a guide 52' and a core 58'. Guide 52' may include a first guide end 51' and a second guide end 53', while core 58' may include a first core end 57' and a second core end 59'.

Figure 4A:
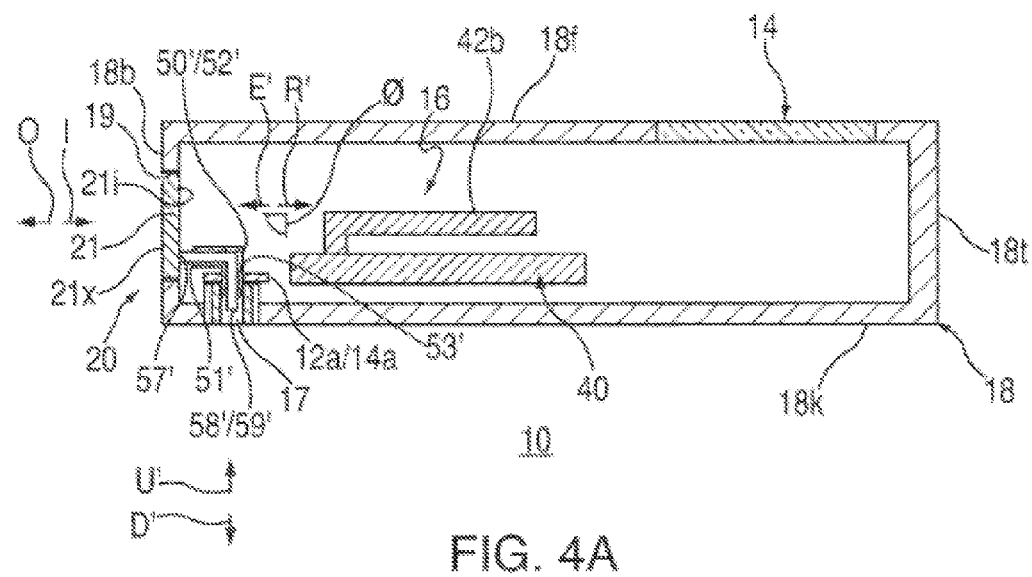
FIG. 4A is a cross-sectional view of the electronic device of FIGS. 1-4, taken from line IVA-IVA of FIG. 3, in accordance with some embodiments of the invention.

When tray 20 is held in its functional or fully loaded position by connector 40, ejector mechanism 50' may be in a retracted position, as shown in FIGS. 3 and 4A. When in such a retracted position, ejector mechanism 50' may be configured to translate a received user input force in the direction of arrow U' at second core end 59' into a translated force in the direction of arrow E' at first core end 57' that may be applied to tray 20. This translated force that may be applied by first core end 57' to tray 20 in the direction of arrow E' may be great enough to overcome a retention force applied by connector 40 on tray 20, such that tray 20 may be at least partially ejected from connector 40 in the direction of arrow O (e.g., from the fully loaded tray position of FIGS. 3 and 4A to the at least partially ejected tray position of FIGS. 5 and 6A).

It is to be noted that any ejector mechanism of ejectable component assembly 16 may apply a translated force onto tray 20 at any suitable portion of tray 20. For example, as shown in FIG. 5, unlike ejector mechanism 50 that may be positioned within housing 18 such that first core end 57 of ejector mechanism 50 may apply a translated force in the direction of arrow E onto a surface of second tray end 23 of tray 20, ejector mechanism 50' may be positioned within housing 18 such that first core end 57' of ejector mechanism 50' may apply a translated force in the direction of arrow E' onto a surface of first tray end 21 of tray 20 (e.g., an inner surface 21*i* of first tray end 21 that may be opposite outer surface 21*x* of first tray end 21).

Figure 6A:
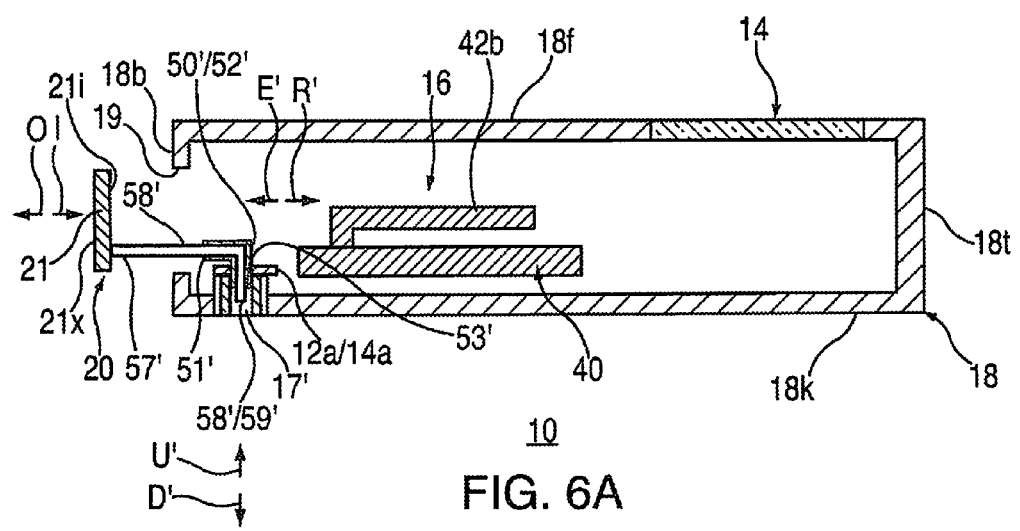
FIG. 6A is a cross-sectional view of the electronic device of FIGS. 1-6, taken from line VIA-VIA of FIG. 5, in accordance with some embodiments of the invention.

Moreover, when tray 20 is not yet held in its functional or fully loaded position by connector 40, tray 20 and ejector mechanism 50' may each be in an ejected position, as shown in FIGS. 5 and 6A. When in such an ejected position, tray 20 may be configured to translate a received tray insertion force in the direction of arrow I at outer surface 21*x* of first tray end 21 into a core retraction force in the direction of arrow R' at inner surface 21*i* of first tray end 21 that may be applied to first core end 57' of core 58'. This retraction force that may be applied by first tray end 21 onto first core end 57' in the direction of arrow R' may be translated by core 58' to apply a device return force in the direction of arrow D' onto second core end 59', such that core 58' of ejector mechanism 50' may move from a first position to a second position (e.g., from the ejected position of ejector mechanism 50' of FIGS. 5 and 6A when tray 20 is at least partially ejected from connector 40 to the retracted position of ejector mechanism 50' of FIGS. 3 and 4A when tray 20 is fully loaded and retained by connector 40).

Ejector mechanism 50' may be substantially similar to ejector mechanism 50, except that ejector mechanism 50' may be positioned within housing 18 such that the direction in which a user input force is applied to ejector mechanism 50' may be neither linear with nor parallel to the direction in which a translated force is applied by ejector mechanism 50' onto tray 20. Instead, ejector mechanism 50' may be positioned within housing 18 such that the direction in which a user input force is applied to ejector mechanism 50' may be off-angle or off-axis with respect to the direction in which a translated force is applied by ejector mechanism 50' onto tray 20.

For example, as shown in FIGS. 3, 4A, 5, and 6A, ejector mechanism 50' may be configured such that the direction of arrow U' in which a user input force may be applied to ejector mechanism 50' can be perpendicular with respect to the direction of arrow E' in which a translated force may be applied by ejector mechanism 50' onto tray 20. Although the direction of arrow U' and the direction of arrow E' are shown to be angled from one another by an angle $\theta$ of 90° (see, e.g., FIG. 4A), the direction of arrow U' and the direction of arrow E' may be angled from one another by any other suitable angle. Therefore, in some embodiments, guide 52' may be non-linear between first guide end 51' and second guide end 53'. In some embodiments, at least a portion of core 58' may be flexible between first core end 57' and second core end 59', for example, such that the flexible portion of core 58' may move along the non-linear path defined by guide 52'. In some embodiments, core 58' may include a rigid portion at first core end 57' such that first core end 57' may more easily apply a translated force onto tray 20. Additionally or alternatively, core 58' may include a rigid portion at second core end 59' such that second core end 57' may more easily receive a user input force. Therefore, in some embodiments, a flexible portion of core 57' may be positioned between two rigid portions of core 57'.

Such that a user of device 10 may eject tray 20 from connector 40 using ejector mechanism 50' (e.g., when tray 20 is held in its functional or fully loaded position by connector 40, as shown in FIGS. 3 and 4A, for example), second core end 59' of core 58' may be accessible to a user at an ejector user interface 17'. Ejector user interface 17' may be provided through any suitable portion of housing 18 for providing a user external to housing 18 with the ability to apply a user input force in the direction of arrow U' onto second core end 59'. For example, as shown in FIGS. 4A and 6A, ejector user interface 17' may be provided through back wall 18k of housing 18. It is to be noted that, although ejector user interface 17' is shown in FIGS. 4A and 6A to be provided through back wall 18k that may be adjacent to bottom wall 18b through which module housing opening 19 is provided, ejector user interface 17' may be provided through the same wall as module housing opening 19 or through any wall of housing 18 having any geometrical or spatial relationship with the wall of housing 18 through which module housing opening 19 is provided. For example, in other embodiments, ejector user interface 17' may be provided through any one of top wall 18t, bottom wall 18b, front wall 18f, left wall 18l, and right wall 18r when module housing opening 19 is provided through bottom wall 18b.

A core and guide of an ejector mechanism of ejectable component assembly 16 may be routed in any suitable manner within housing 18 such that the ejector user interface of that ejector mechanism may be provided through any suitable portion of housing 18. In some embodiments, an ejector user interface may be provided through housing 18 at the same location as another component of device 10. For example, as shown in FIGS. 4A and 6A, at least a portion of an input component assembly 12a and/or at least a portion of an output component assembly 14a of device 10 may be positioned within housing 18 adjacent ejector user interface 17' of ejector mechanism 50'. Ejector user interface 17' may be configured not only to provide a user external to housing 18 with the ability to apply a user input force in the direction of arrow U' onto second core end 59', but also to expose component assembly 12a/14a or to allow information to be communicated between component assembly 12a/14a and the environment external to housing 18.

Input component assembly 12a of FIGS. 4A and 6A may be any suitable input component assembly similar to input component assembly 12 and output component assembly 14a may be any suitable output component assembly similar to output component assembly 14. For example, in some embodiments, output component assembly 14a may be an audio speaker, and ejector user interface 17' may be at least a portion of a speaker grill for passing audio data from output component assembly 14a to a user, while also allowing a user to apply a user input force in the direction of arrow U' onto second core end 59'. As another example, in some embodiments, input component assembly 12a may be a microphone, and ejector user interface 17' may be at least a portion of a microphone port for passing audio data from an entity external to housing 18 to input component assembly 12a, while also allowing a user to apply a user input force in the direction of arrow U' onto second core end 59'.

Although the direction of arrow U' and the direction of arrow E' of ejector mechanism 50' are shown to be angled from one another by an angle θ within the same plane in a three-dimensional space (e.g., within the plane of FIG. 4A), the direction in which a user input force may be applied to an ejector mechanism and the direction in which a translated force may be applied by an ejector mechanism onto tray 20 may be angled from one another within different planes. For example, as shown in FIGS. 1-3, 4B, 4C, 5, 6B, and 6C, ejectable component assembly 16 may include an ejector mechanism 50" in addition to or as an alternative to one or both of ejector mechanisms 50 and 50'. Ejector mechanism 50" may include a guide 52" and a core 58". Guide 52" may include a first guide end 51" and a second guide end 53", while core 58" may include a first core end 57" and a second core end 59".

Figure 4B:
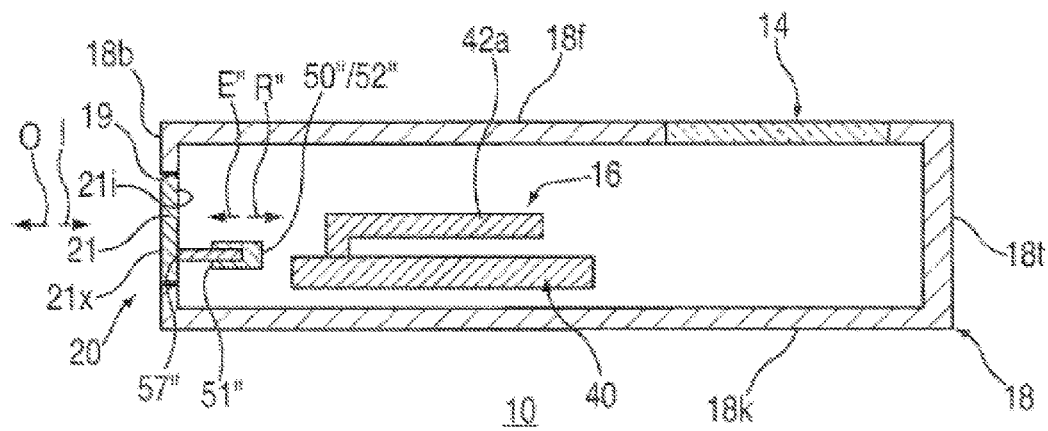
FIG. 4B is a cross-sectional view of the electronic device of FIGS. 1-4A, taken from line IVB-IVB of FIG. 3, in accordance with some embodiments of the invention.
Figure 4C:
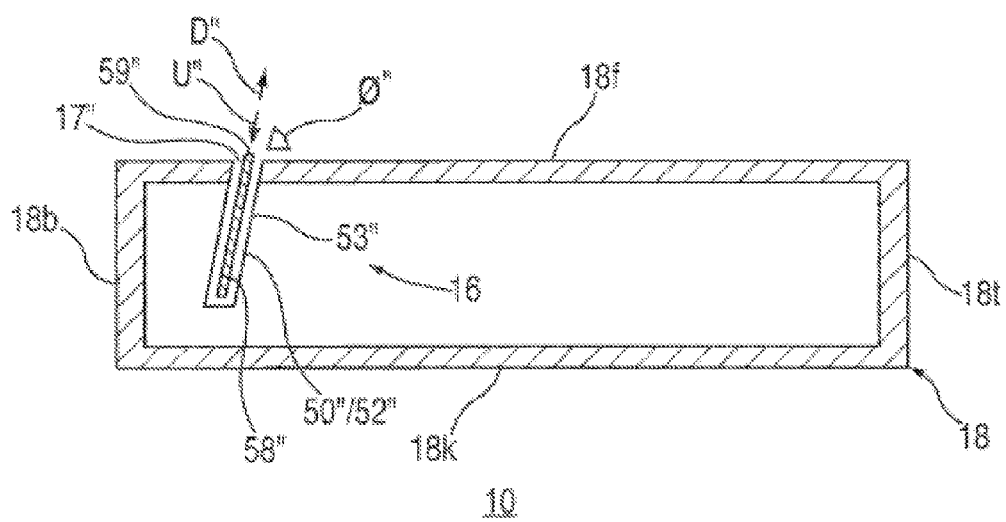
FIG. 4C is a cross-sectional view of the electronic device of FIGS. 1-4B, taken from line IVC-IVC of FIG. 3, in accordance with some embodiments of the invention.

When tray 20 is held in its functional or fully loaded position by connector 40, ejector mechanism 50" may be in a retracted position, as shown in FIGS. 3, 4B, and 4C. When in such a retracted position, ejector mechanism 50" may be configured to translate a received user input force in the direction of arrow U" at second core end 59" into a translated force in the direction of arrow E" at first core end 57" that may be applied to tray 20. This translated force that may be applied by first core end 57" to tray 20 in the direction of arrow E" may be great enough to overcome a retention force applied by connector 40 on tray 20, such that tray 20 may be at least partially ejected from connector 40 in the direction of arrow O (e.g., from the fully loaded tray position of FIGS. 3, 4B, and 4C to the at least partially ejected tray position of FIGS. 5, 6B, and 6C).

It is to be noted that any ejector mechanism of ejectable component assembly 16 may apply a translated force onto tray 20 at any suitable portion of tray 20. For example, as shown in FIG. 5, unlike ejector mechanism 50 that may be positioned within housing 18 such that first core end 57 of ejector mechanism 50 may apply a translated force in the direction of arrow E onto a surface of second tray end 23 of tray 20, ejector mechanism 50" may be positioned within housing 18 such that first core end 57" of ejector mechanism 50" may apply a translated force in the direction of arrow E" onto a surface of first tray end 21 of tray 20 (e.g., inner surface 21i of first tray end 21 that may be opposite outer surface 21x of first tray end 21).

Figure 6B:
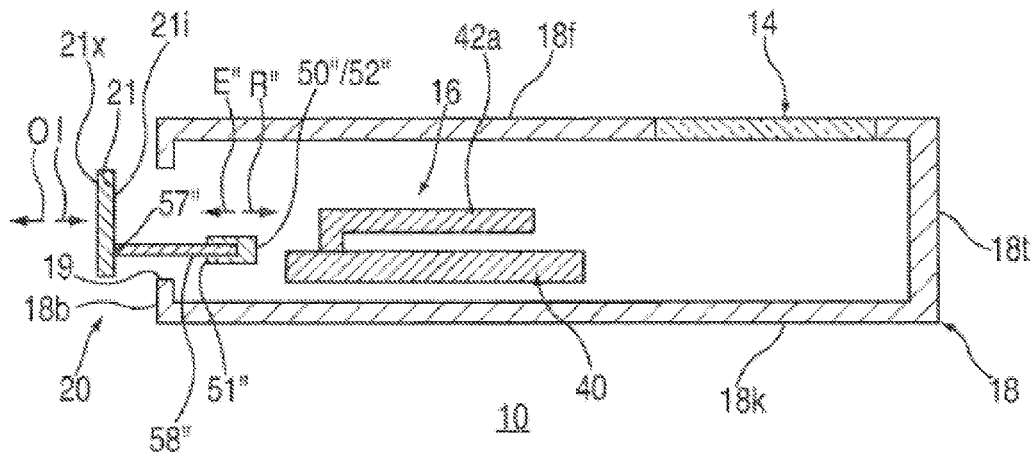
FIG. 6B is a cross-sectional view of the electronic device of FIGS. 1-6A, taken from line VIB-VIB of FIG. 5, in accordance with some embodiments of the invention.
Figure 6C:
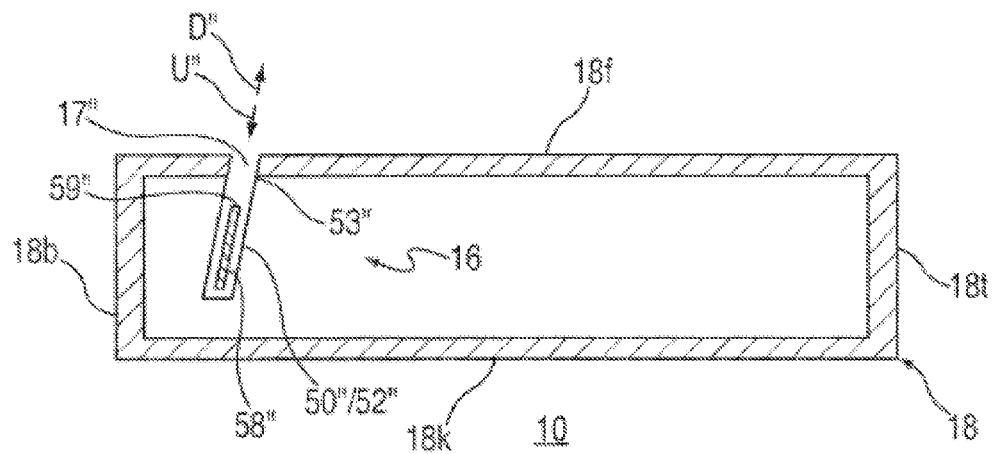
FIG. 6C is a cross-sectional view of the electronic device of FIGS. 1-6B, taken from line VIC-VIC of FIG. 5, in accordance with some embodiments of the invention.

Moreover, when tray 20 is not yet held in its functional or fully loaded position by connector 40, tray 20 and ejector mechanism 50" may each be in an ejected position, as shown in FIGS. 5, 6B, and 6C. When in such an ejected position, tray 20 may be configured to translate a received tray insertion force in the direction of arrow I at outer surface 21x of first tray end 21 into a core retraction force in the direction of arrow R" at inner surface 21i of first tray end 21 that may be applied to first core end 57" of core 58". This retraction force that may be applied by first tray end 21 onto first core end 57" in the direction of arrow R" may be translated by core 58" to apply a device return force in the direction of arrow D" onto second core end 59", such that core 58" of ejector mechanism 50" may move from a first position to a second position (e.g., from the ejected position of ejector mechanism 50" of FIGS. 5, 6B, and 6C when tray 20 is at least partially ejected from connector 40 to the retracted position of ejector mechanism 50" of FIGS. 3, 4B, and 4C when tray 20 is fully loaded and retained by connector 40).

Ejector mechanism 50" may be substantially similar to ejector mechanism 50 and/or ejector mechanism 50', except that ejector mechanism 50" may be positioned within housing 18 such that the direction in which a user input force is applied to ejector mechanism 50" may be neither linear with, nor parallel to, nor in the same plane as the direction in which a translated force is applied by ejector mechanism 50" onto tray 20. Instead, ejector mechanism 50" may be positioned within housing 18 such that the direction in which a user input force is applied to ejector mechanism 50" may be skew with respect to the direction in which a translated force is applied by ejector mechanism 50" onto tray 20.

For example, as shown in FIGS. 3, 4B, 4C, 5, 6B, and 6C, ejector mechanism 50" may be configured such that the direction of arrow U" in which a user input force may be applied to ejector mechanism 50" can be skew with respect to the direction of arrow E" in which a translated force may be applied by ejector mechanism 50" onto tray 20. That is, the direction of arrow U" and the direction of arrow E" may not lie in the same plane in a three-dimensional space (e.g., the direction of arrow U" may lie in the plane of FIGS. 4C and 6C, while the direction of arrow E'" may lie in the different plane of FIGS. 4B and 6B).

Such that a user of device 10 may eject tray 20 from connector 40 using ejector mechanism 50" (e.g., when tray 20 is held in its functional or fully loaded position by connector 40, as shown in FIGS. 3, 4B, and 4C, for example), second core end 59" of core 58" may be accessible to a user at an ejector user interface 17". Ejector user interface 17" may be provided through any suitable portion of housing 18 for providing a user external to housing 18 with the ability to apply a user input force in the direction of arrow U" onto second core end 59". For example, as shown in FIGS. 1, 4C, and 6C, ejector user interface 17" may be provided through front wall 18f of housing 18.

It is to be noted that, although ejector user interface 17" is shown in FIGS. 1, 4C, and 6C to be provided through front wall 18f that may be adjacent to bottom wall 18b through which module housing opening 19 is provided, ejector user interface 17" may be provided through the same wall as module housing opening 19 or through any wall of housing 18 having any geometrical or spatial relationship with the wall of housing 18 through which module housing opening 19 is provided. For example, in other embodiments, ejector user interface 17" may be provided through any one of top wall 18t, bottom wall 18b, back wall 18k, left wall 18l, and right wall 18r when module housing opening 19 is provided through bottom wall 18b.

A ejector user interface of an ejector mechanism of ejectable component assembly 16 may be provided with respect to a wall of housing 18 such that a user external to housing 18 may apply a user input force onto a core of the ejector mechanism in a direction forming any suitable angle with that wall of housing 18. For example, as shown in FIG. 4C, ejector user interface 17" may be provided through front wall 18f of housing 18 such that a user external to housing 18 may apply a user input force onto core 58" in the direction of arrow U" that may form an angle θ' with the outer surface of front wall 18f. Angle θ' may be any suitable angle, such as 90°, 45°, 5°, or any other suitable angle.

Forces may be applied to an ejector mechanism of ejectable component assembly 16 by entities other than tray 20 and a user input. For example, as shown in FIGS. 2, 4D, 6D, and 6E, ejectable component assembly 16 may include an ejector mechanism 50'" in addition to or as an alternative to one or more of ejector mechanisms 50, 50', and 50". Ejector mechanism 50'" may include a guide 52'" and a core 58'". Guide 52'" may include a first guide end 51'" and a second guide end 53'", while core 58'" may include a first core end 57'" and a second core end 59'".

Figure 4D:
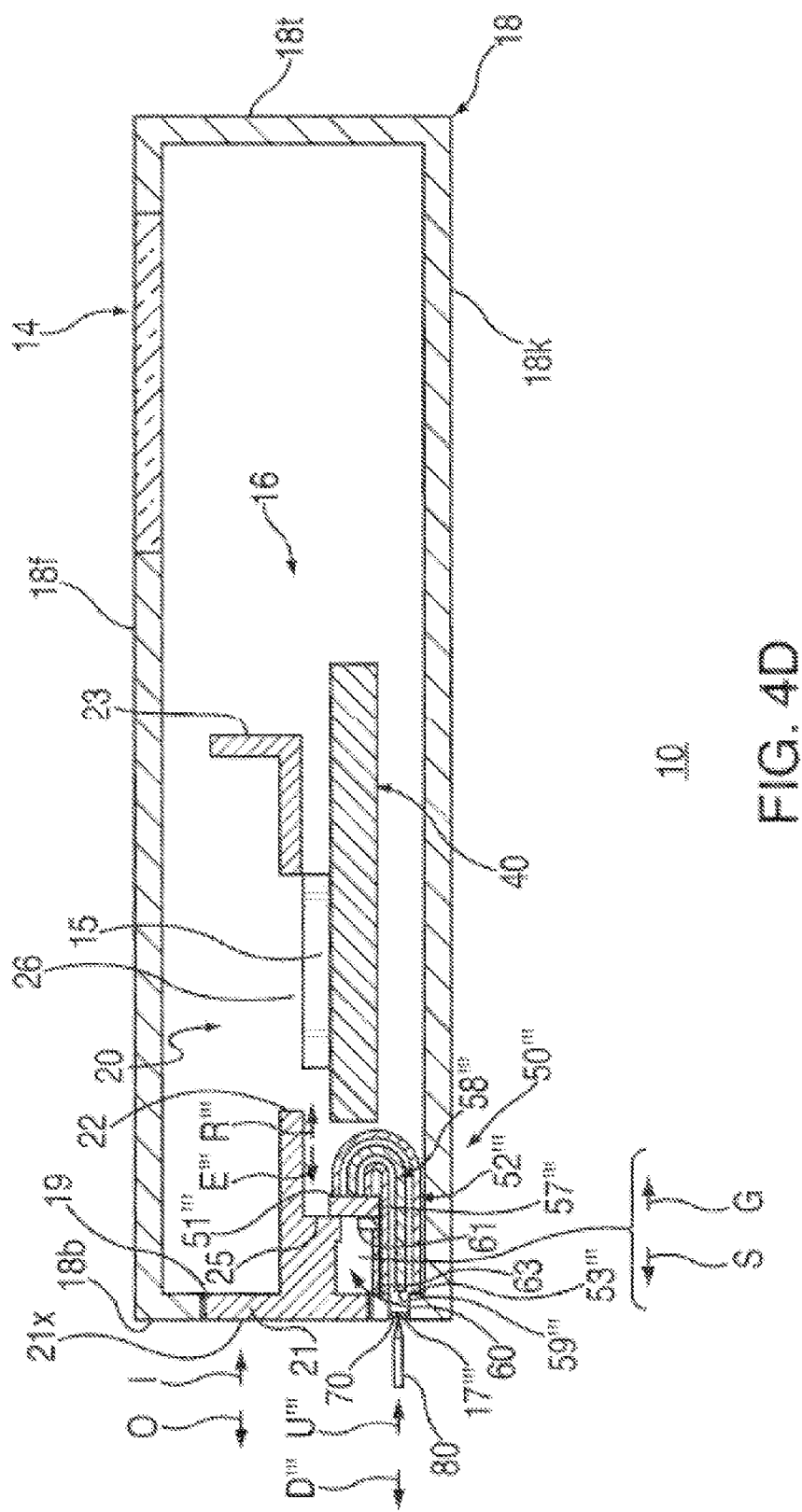
FIG. 4D is a cross-sectional view of the electronic device of FIGS. 1-4C, taken from line IVD-IVD of FIG. 3, in accordance with some embodiments of the invention.

When tray 20 is held in its functional or fully loaded position by connector 40, ejector mechanism 50'" may be in a retracted position, as shown in FIGS. 3 and 4D. When in such a retracted position, ejector mechanism 50'" may be configured to translate a received user input force in the direction of arrow U'" at second core end 59'" into a translated force in the direction of arrow E'" at first core end 57'" that may be applied to tray 20. This translated force that may be applied by first core end 57'" to tray 20 in the direction of arrow E'" may be great enough to overcome a retention force applied by connector 40 on tray 20, such that tray 20 may be at least partially ejected from connector 40 in the direction of arrow O (e.g., from the fully loaded tray position of FIGS. 3 and 4D to the at least partially ejected tray position of FIGS. 5 and 6D).

It is to be noted that any ejector mechanism of ejectable component assembly 16 may apply a translated force onto tray 20 at any suitable portion of tray 20. For example, as shown in FIG. 4D, unlike ejector mechanism 50 that may be positioned within housing 18 such that first core end 57 of ejector mechanism 50 may apply a translated force in the direction of arrow E onto a surface of second tray end 23 of tray 20, ejector mechanism 50'" may be positioned within housing 18 such that first core end 57'" of ejector mechanism 50'" may apply a translated force in the direction of arrow E'" onto a surface of body portion 22 of tray 20 (e.g., a body surface 25 of body portion 22). Although, in other embodiments, ejector mechanism 50'" may be positioned within housing 18 such that first core end 57'" of ejector mechanism 50'" may apply a translated force in the direction of arrow E'" onto any other suitable surface or portion of tray 20.

An ejector mechanism of ejectable component assembly 16 may be provided with apparatus to return the ejector mechanism to its retracted position once tray 20 has been at least partially ejected from connector 40. For example, as shown in FIGS. 2, 4D, 6D, and 6E, ejector mechanism 50'" may include a core return component 60 that may be configured to move core 58'" back to its retracted position of FIG. 4D once the application of a user input force on core 58'" has been terminated. Core return component 60 may include a core return head 61 and a core return driver 63 that may be configured to exert a return force on core return head 61 for moving core 58'" back to its retracted position.

Core return component 60 may be positioned within housing 18 adjacent first core end 57'" of core 58'", such that as first core end 57'" applies a translated force in the direction of arrow E'" onto tray 20 for moving tray 20 from the fully loaded tray position of FIGS. 3 and 4D to the at least partially ejected tray position of FIGS. 5 and 6D, first core end 57'" may also apply an outward return force in the direction of arrow S onto core return component 60. For example, core return driver 63 may be a spring or any other suitable element that may be compressed or otherwise deformed by the application of the outward return force in the direction of arrow S by core 58'" on core return head 61. Core return component 60 may be configured such that, once the application of a user input force on core 58'" in the direction of arrow U'" has been terminated and, thus, once the application of both a translated force by first core end 57'" on tray 20 in the direction of arrow E'" and an outward return force by first core end 57'" on core return head 61 in the direction of arrow S have been terminated, core return driver 63 may be biased to exert an inward return force in the direction of arrow G onto core return head 61 for moving core 58'" back to its retracted position.

Figure 6E:
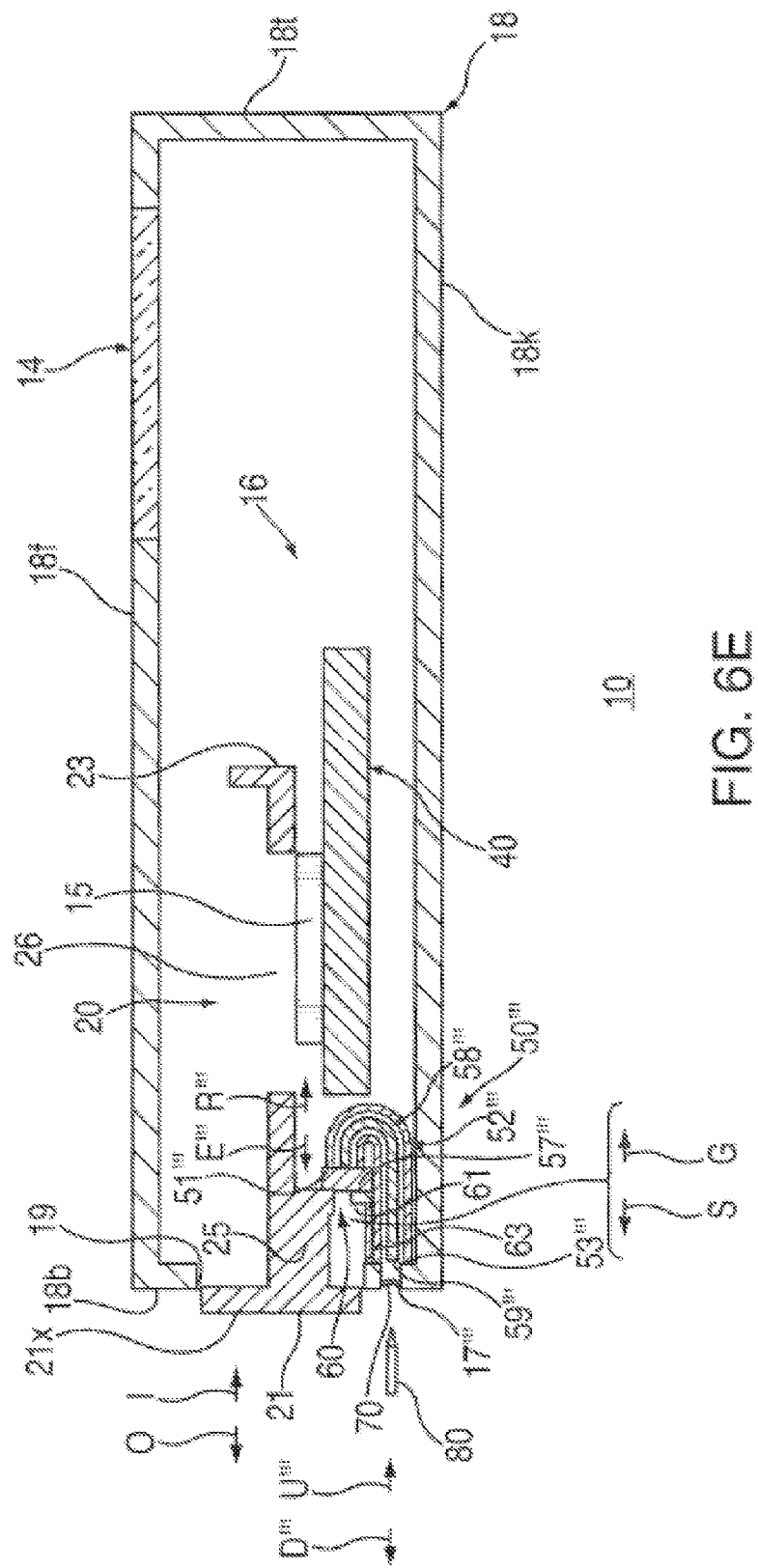
FIG. 6E is a cross-sectional view of the electronic device of FIGS. 1-6D, similar to FIG. 6D, but with the ejectable component assembly in a fourth stage of actuation, in accordance with some embodiments of the invention.

For example, ejector mechanism 50'" may be configured such that core return head 61 may translate a received inward return force from core return driver 63 in the direction of arrow G into a core retraction force in the direction of arrow R'" at first core end 57'". This retraction force that may be applied by core return component 60 onto first core end 57'" in the direction of arrow R'" may be translated by core 58'" to apply a device return force in the direction of arrow D'" onto second core end 59'", such that core 58'" of ejector mechanism 50'" may move from a first position to a second position (e.g., from the ejected position of ejector mechanism 50'" of FIGS. 5 and 6D when tray 20 is at least partially ejected from connector 40 to the retracted position of ejector mechanism 50'" of FIGS. 3, 4D, and 6E). Therefore, once a user input force in the direction of arrow U'" has been applied to core 58'" such that core 58'" has moved tray 20 from the fully loaded tray position of FIGS. 3 and 4D to the at least partially ejected tray position of FIGS. 5 and 6D, that user input force may be terminated such that the application of an inward return force in the direction of arrow G by core return component 60 onto core 58''' may return core 58''' back to its retracted position while tray 20 may remain in its at least partially ejected tray position, as shown in FIG. 6E.

Such that a user of device 10 may eject tray 20 from connector 40 using ejector mechanism 50''' (e.g., when tray 20 is held in its functional or fully loaded position by connector 40, as shown in FIGS. 3 and 4D, for example), second core end 59''' of core 58''' may be accessible to a user at an ejector user interface 17'''. Ejector user interface 17''' may be provided through any suitable portion of housing 18 for providing a user external to housing 18 with the ability to apply a user input force in the direction of arrow U''' onto second core end 59'''. For example, as shown in FIGS. 4D, 6D, and 6E, ejector user interface 17''' may be provided through bottom wall 18b of housing 18. It is to be noted that, although ejector user interface 17''' is shown in FIGS. 4D, 6D, and 6E to be provided through the same bottom wall 18b through which module housing opening 19 is provided (e.g., below module housing opening 19), ejector user interface 17''' may be provided through a different wall of housing 18 having any geometrical or spatial relationship with the wall of housing 18 through which module housing opening 19 is provided. For example, in other embodiments, ejector user interface 17''' may be provided through any one of top wall 18t, front wall 18f, back wall 18k, left wall 18l, and right wall 18r when module housing opening 19 is provided through bottom wall 18b.

A user of device 10 may at least partially eject tray 20 from connector 40 by applying a user input force onto a portion of an ejector mechanism of ejectable component assembly 16 using any suitable user instrument. For example, as shown in FIGS. 4D and 6D, a user may apply a user input force in the direction of arrow U''' onto second core end 59''' through ejector user interface 17''' of ejector mechanism 50''' using any suitable user instrument 80. In some embodiments, user instrument 80 may be a paperclip or any other suitable instrument that may be configured to have any suitable size and structure for applying an appropriate force onto second core end 59''' through ejector user interface 17'''. In other embodiments, user instrument 80 may be a finger of the user. Although not shown, user instrument 80 or an instrument similar to user instrument 80 may be utilized by a user to apply a user input force onto any other ejector mechanism of ejectable component assembly 16, such as one or more of ejector mechanisms 50, 50', and 50".

While an ejector user interface of an ejector mechanism of ejectable component assembly 16 may be an opening provided through a wall of housing 18, such that a user instrument may directly contact a core of the ejector mechanism (e.g., as shown with respect to ejector user interface 17 of ejector mechanism 50), ejector user interface 17''' of ejector mechanism 50''' may include not only an opening through bottom wall 18b of housing 18, but ejector user interface 17''' of ejector mechanism 50''' may also include a deformable cover that may be positioned within or that may otherwise cover at least a portion of that opening. For example, as shown in FIGS. 4D, 6D, and 6E, ejector user interface 17''' may include an opening through housing 18 as well as a deformable cover 70 that may be positioned within the opening or that may be positioned in any other suitable way to cover at least a portion of the opening through bottom wall 18b of housing 18. Cover 70 may serve as a barrier for preventing debris from entering into and/or exiting from housing 18 through user interface 17''' while at the same time allowing a user to apply a user input force in the direction of arrow U''' onto second core end 59''' through ejector user interface 17''' (e.g., using user instrument 80). Cover 70 may be made of any suitable material that may deform to move core 58''' when a user applies a user input force in the direction of arrow U''' onto cover 70. For example, cover 70 may be an elastic filter that can flex when a user input force is applied to it and that can prevent certain fluids from passing through it (e.g., water, dirt, or other debris that could jeopardize the performance of device 10). In other embodiments, cover 70 may not be a filter. In other embodiments, ejector user interface 17''' may not include a cover 70, but may instead just include an opening provided through housing 18 such that a user may apply a user input force in the direction of arrow U''' directly onto second core end 59'''.

Cover 70 of ejector user interface 17''' may be configured to return core 58''' to its retracted position once tray 20 has been at least partially ejected from connector 40. In some embodiments, in addition to or as an alternative to providing ejector mechanism 50''' with core return component 60, cover 70 may be configured to move core 58''' back to its retracted position of FIG. 4D once the application of a user input force on core 58''' has been terminated. For example, cover 70 may be configured such that, once the application of a user input force on cover 70 in the direction of arrow U''' has been terminated, cover 70 may be biased to return from its deformed state of FIG. 6D back to its original state of FIGS. 4D and 6F. By connecting second core end 59''' to cover 70 (e.g., by any suitable adhesive or by providing cover 70 and second core end 59''' as a single unitary component), cover 70 may be configured to pull core 58''' back to its retracted core position of FIG. 6F when cover 70 returns from its deformed state of FIG. 6D back to its original state of FIG. 6F.

Figure 6F:
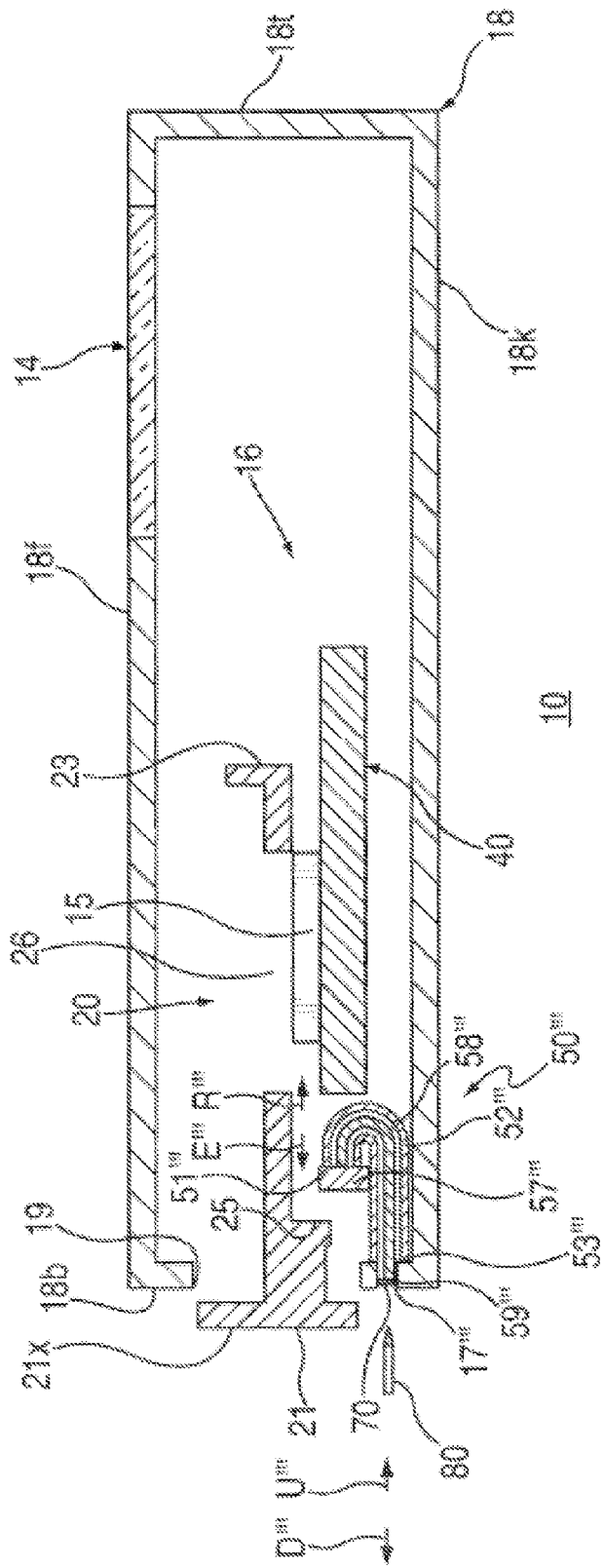
FIG. 6F is a cross-sectional view of the electronic device of FIGS. 1-6E, similar to FIG. 6E, in accordance with some embodiments of the invention.

By configuring cover 70 to be biased to return from its deformed state to its original state, cover 70 may apply a device return force in the direction of arrow D''' onto second core end 59''' for pulling core 58''' from the ejected position of ejector mechanism 50''' of FIGS. 5 and 6D when tray 20 is at least partially ejected from connector 40 to the retracted position of ejector mechanism 50''' of FIGS. 3, 4D, and 6F). Therefore, once a user input force in the direction of arrow U''' has been applied to core 58''' such that core 58''' has moved tray 20 from the fully loaded tray position of FIGS. 3 and 4D to the at least partially ejected tray position of FIGS. 5 and 6D, that user input force may be terminated such that the application of a device return force in the direction of arrow D''' by cover 70 onto core 58''' may return core 58''' back to its retracted position while tray 20 may remain in its at least partially ejected tray position, as shown in FIG. 6F.

A core and guide of an ejector mechanism of ejectable component assembly 16 may be shaped with respect to one another such that the core may not travel in a particular manner with respect to the guide. For example, as shown in FIGS. 4D, 6D, and 6E, first core end 57''' of core 58''' may be configured such that it may not pass through first guide end 51''' of guide 52''' and along guide 52''' towards second guide end 53'''. As shown, first core end 57''' may be sized such that it cannot fit through first guide end 51. This geometry may prevent the application of an inward return force in the direction of arrow G by core return component 60 onto first core end 57''' from pushing first core end 57''' through first guide end 51''', as such movement of core 58''' may push second core end 59''' too far out through ejector user interface 17'''. In other embodiments, any other suitable portion of core 58''' besides first core end 57''' may be sized such that it cannot fit through first guide end 51.

It is to be understood that an ejector mechanism of ejectable component assembly 16 may be made of any suitable component or collection of any suitable components. A guide may be any suitable component or collection of components that may be capable of regulating at least a portion of the path along which a first force applied to a first end of a core may be translated into a second force at a second end of the core.

Figure 7:
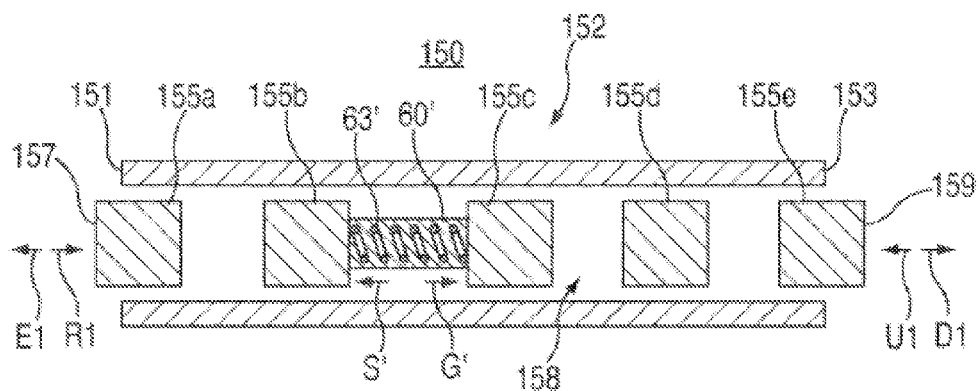
FIG. 7 is a cross-sectional view, similar to FIG. 4, of an alternative embodiment of a portion of an ejectable component assembly, in accordance with some embodiments of the invention.

In some embodiments, the core may include multiple core components that can be moved along a guide. For example, as shown in FIG. 7, an ejector mechanism 150 may include a guide 152 that may extend between a first guide end 151 and a second guide end 153. Ejector mechanism 150 may also include a core 158 that may be capable of translating a first force applied to a first end of core 158 into a second force at a second end of core 158. For example, core 158 may include at least two distinct core components 155 (e.g., five core components 155*a*, 155*b*, 155*c*, 155*d*, and 155*e* arranged consecutively). A portion of core component 155*a* may provide a first core end 157 of core 158 and a portion of core component 155*e* may provide a second core end 159 of core 158.

Despite including distinct core components, ejector mechanism 150 may be configured such that, when a user input force may be applied to second core end 159 of core component 155*e* in the direction of arrow U1, core 158 may translate that user input force into an ejection force at first core end 157 of core component 155*a* in the direction of arrow E1. Similarly, ejector mechanism 150 may be configured such that, when a retraction force may be applied to first core end 157 of core component 155*a* in the direction of arrow R1, core 158 may translate that retraction force into a device return force at second core end 159 of core component 155*e* in the direction of arrow D1.

For example, core components 155*a*-155*e* may each be individual spheres or other shapes that may translate a first force received from a first neighboring component into a second force for application onto a second neighboring component. Each one of core components 155*a*-155*e* may be made of the same material or may be of different compositions. For example, core components 155*a* and 155*e* may be solid components, while core components 155*b*-155*d* positioned between core components 155*a* and 155*e* may each be components made of a liquid or a gas. For example, core 158 may include at least some liquid contained within guide 152. In such embodiments, guide ends 151 and 153 may be configured to prevent respective end core components 155*a* and 155*e* from completely exiting guide 152, and end core components 155*a* and 155*e* may be configured to prevent any portion or all of internal core components 155*b*-155*d* from exiting guide 152 (e.g., if the internal core components are a liquid or gas).

An ejector mechanism may be provided with apparatus along any portion of the core and/or guide of the ejector mechanism to return the ejector mechanism to its retracted position. For example, unlike ejector mechanism 50''' that may include a core return component 60 positioned at a first core end 57''' and a first guide end 51''', ejector mechanism 150 may be provided with a core return component 60' positioned anywhere along ejector mechanism 150 (e.g., anywhere along ejector mechanism 150 between first core end 157 and second core end 159 and/or anywhere between first guide end 151 and second guide end 153).

As shown in FIG. 7, for example, ejector mechanism 150 may include a core mechanism 60' positioned between core component 155*b* and core component 155*c* that may be configured to move core 158 back to its retracted position once the application of a user input force on core 158 has been terminated. Core return component 60' may include a core return driver 63' that may function similarly to core return driver 63 of core return component 60 for returning core 158 of ejector mechanism 150 back to an original position once a user input force is terminated. For example, core return driver 63' may be a spring or any other suitable element that may be compressed or otherwise deformed by the application of an outward return force in the direction of arrow S' by core component 155*c* on core return driver 63'. Core return component 60' may be configured such that, once the application of a user input force on core component 155*e* in the direction of arrow U1 has been terminated and, thus, once the application of an outward return force by core component 155*c* on core return driver 63' in the direction of arrow S' has been terminated, core return driver 63' may be biased to exert an inward return force in the direction of arrow G' onto core component 155*c* for moving core 158 back to its retracted position. Any one or more of ejector mechanisms 50, 50', 50", and 50''' may be configured similarly to ejector mechanism 150.

Figure 8:
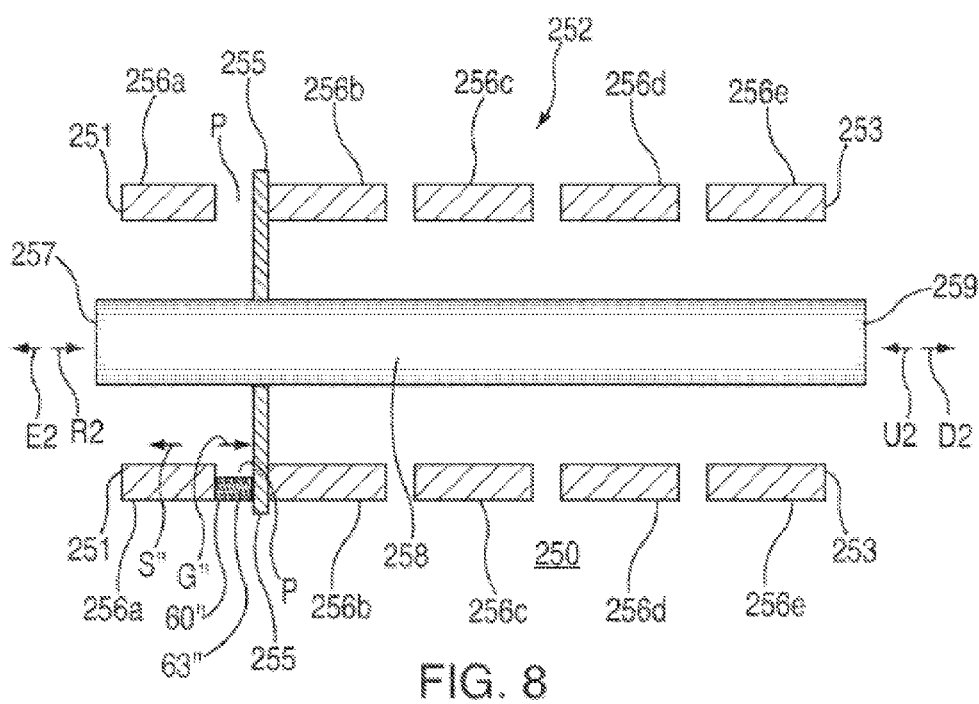
FIG. 8 is a cross-sectional view, similar to FIGS. 4 and 7, of another alternative embodiment of a portion of an ejectable component assembly, in accordance with some embodiments of the invention.

In some embodiments, a core may move along a guide that includes multiple guide components. For example, as shown in FIG. 8, an ejector mechanism 250 may include a guide 252 that may extend between a first guide end 251 and a second guide end 253. Ejector mechanism 250 may also include a core 258 that may be capable of translating a first force applied to a first core end 257 of core 258 into a second force at a second core end 259 of core 258. For example, guide 252 may include at least two distinct guide components 256 (e.g., five guide components 256*a*, 256*b*, 256*c*, 256*d*, and 256*e* arranged consecutively along a path of guide 252). A portion of guide component 256*a* may provide first guide end 251 of guide 252 and a portion of guide component 256*e* may provide second guide end 253 of guide 252.

Despite including distinct guide components, ejector mechanism 250 may be configured such that, when a user input force may be applied to second core end 259 in the direction of arrow U2, core 258 may translate that user input force into an ejection force at first core end 257 in the direction of arrow E2. Similarly, ejector mechanism 250 may be configured such that, when a retraction force may be applied to first core end 257 in the direction of arrow R2, core 258 may translate that retraction force into a device return force at second core end 259 in the direction of arrow D2.

Core 258 may be provided with a prevention element 255 that may interact with guide 252 in any suitable way for preventing any particular type of movement of core 258 along guide 252. For example, as shown in FIG. 8, prevention element 255 may extend from core 258 into a spacing P between guide components 256*a* and 256*b*, such that the movement of prevention element 255 may be limited to movement within that spacing P. This may similarly prevent first core end 257 and/or second core end 259 from moving outside of a particular range of positions.

An ejector mechanism may be provided with apparatus along any portion of the core and/or guide of the ejector mechanism to return the ejector mechanism to its retracted position. For example, unlike ejector mechanism 50''' that may include a core return component 60 positioned at a first core end 57''' and a first guide end 51''', ejector mechanism 250 may be provided with a core return component 60" positioned anywhere along ejector mechanism 250 (e.g., anywhere along ejector mechanism 250 between first core end 257 and second core end 259 and/or anywhere between first guide end 251 and second guide end 253).

As shown in FIG. 8, for example, ejector mechanism 250 may include a core mechanism 60" positioned within spacing P and between prevention element 255 and guide component 256a. Core mechanism 60" may be configured to move core 258 back to its retracted position once the application of a user input force on core 258 has been terminated. Core return component 60" may include a core return driver 63" that may function similarly to core return driver 63 of core return component 60 for returning core 258 of ejector mechanism 250 back to an original position once a user input force is terminated. For example, core return driver 63" may be a spring or any other suitable element that may be compressed or otherwise deformed by the application of an outward return force in the direction of arrow S" by prevention element 255 or any other portion of core 258 on core return driver 63". Core return component 60" may be configured such that, once the application of a user input force on second core end 259 of core 258 in the direction of arrow U2 has been terminated and, thus, once the application of an outward return force by prevention element 255 on core return driver 63" in the direction of arrow S" has been terminated, core return driver 63" may be biased to exert an inward return force in the direction of arrow G" onto prevention element 255 for moving core 258 back to its retracted position. Any one or more of ejector mechanisms 50, 50', 50", and 50''' may be configured similarly to ejector mechanism 250.

Figure 9:
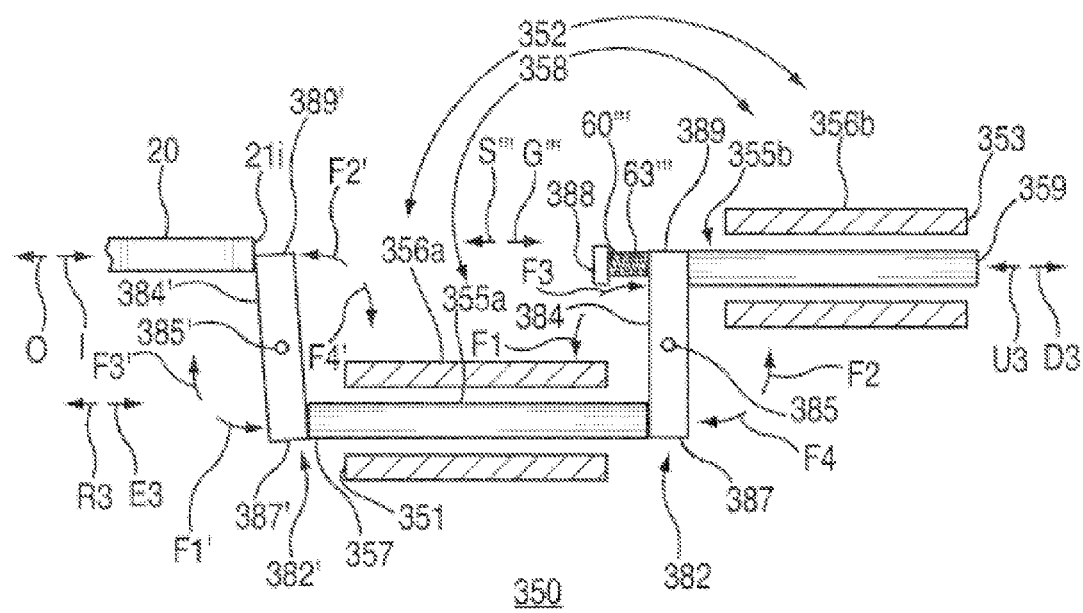
FIG. 9 is a cross-sectional view, similar to FIGS. 4, 7, and 8, of another alternative embodiment of a portion of an ejectable component assembly, in accordance with some embodiments of the invention.

In some embodiments, an ejector mechanism may be configured to receive a user input force at one end as a pushing force that be translated into an ejection force at another end as a pulling force. This may allow for at least a portion of a core to be a soft material (e.g., a woven string) that may be better configured to be pulled under tension than pushed to eject a tray from a connector. For example, as shown in FIG. 9, an ejector mechanism 350 may include a guide 352 that may extend between a first guide end 351 and a second guide end 353. Guide 352 may include a first guide component 356a that may include first guide end 351 and a second guide component 356b that may include second guide end 353. Ejector mechanism 350 may also include a core 358 that may be capable of translating a pushing force applied to a second core end 359 of core 358 into a pulling force at a first core end 357 of core 358 for ejecting a tray from a connector. Core 358 may include a first core component 355a and a second core component 355b. A portion of first core component 355a may provide first core end 357 of core 358 and a portion of second core component 355b may provide second core end 359 of core 358.

Ejector mechanism 350 may also include a push/pull actuator 382 for translating a pushing force at a first core component into a pulling force on a second core component. For example, as shown in FIG. 9, push/pull actuator 382 may be positioned to interface with both first core component 355a and second core component 355b of core 358 to translate a pushing force received by second core component 355b into a pulling force on first core component 355a. Push/pull actuator 382 may include an actuator member 384 that may rotate or otherwise move about a pivot 385. Actuator member 384 may be configured to include a first actuator end 387 and a second actuator end 389 that may be provided on opposite sides of pivot 385. First actuator end 387 may be positioned for interfacing with first core component 355a and second actuator end 389 may be positioned for interfacing with second core component 355b.

Ejector mechanism 350 may be configured such that, when a user input force is applied to second core end 359 of second core component 355b in the direction of arrow U3 (e.g., as a pushing force that may cause second core end 359 to move away from the source of the pushing force), core component 355b may apply a first actuator force to second actuator end 389 of actuator member 384 in the direction of arrow F1. This first force in the direction of arrow F1 may cause actuator member 384 to move about pivot 385 such that a second actuator force may be applied to first actuator end 387 of actuator member 384 in the direction of arrow F2. This second actuator force in the direction of arrow F2 may be applied by first actuator end 387 of actuator member 384 onto first core component 355a (e.g., as a pulling force that may cause first core component 355a to move towards the source of the pulling force) for moving first core end 357 of core component 355a with an ejection force in the direction of arrow E3.

Ejector mechanism 350 may also be provided with an additional push/pull actuator 382' that may be positioned to interface with both first core component 355a and tray 20 to translate a pulling force received by first core component 355a into a pushing force on tray 20. Push/pull actuator 382' may include an actuator member 384' that may rotate or otherwise move about a pivot 385'. Actuator member 384' may be configured to include a first actuator end 387' and a second actuator end 389' that may be provided on opposite sides of pivot 385'. First actuator end 387' may be positioned for interfacing with first core component 355a at first core end 357 and second actuator end 389' may be positioned for interfacing with tray 20 (e.g., at any suitable surface of tray 20, such as internal tray surface 21i).

Ejector mechanism 350 may be configured such that, when an ejection force is applied by first core end 357 of first core component 355a in the direction of arrow E3 (e.g., as a pulling force), core component 355a may apply a first actuator force to first actuator end 387' of actuator member 384' in the direction of arrow F1'. This first force in the direction of arrow F1' may cause actuator member 384' to move about pivot 385' such that a second actuator force may be applied to second actuator end 389' of actuator member 384' in the direction of arrow F2'. This second actuator force in the direction of arrow F2' may be applied by second actuator end 389' of actuator member 384' onto tray 20 (e.g., as a pushing force that may cause tray 20 to move away from the source of the pushing force) for at least partially ejecting tray 20 in the direction of arrow O.

First core end 357 of first core component 355a may be coupled to first actuator end 387' of actuator member 384' and another end of first core component 355a may be coupled to first actuator end 387 of actuator member 384. First core component 355a may be at least partially made of a material that is soft, such as woven string, and that may be better configured to be pulled under tension between first actuator end 387 of actuator member 384 and first actuator end 387' of actuator member 384' than to be pushed. On the other hand, second core component 355b may not be coupled to second actuator end 389 of actuator member 384. For example, second core component 355b may be made of a material that is hard enough to translate a pushing force received at second core end 359 into a first force in the direction of arrow F1 onto second actuator end 389 of actuator member 384.

An ejector mechanism may be provided with apparatus along any portion of the core and/or guide of the ejector mechanism to return the ejector mechanism to its retracted position. For example, unlike ejector mechanism 50''' that may include a core return component 60 positioned at a first core end 57''' and a first guide end 51''', ejector mechanism 350 may be provided with a core return component 60''' positioned anywhere along ejector mechanism 350 (e.g., anywhere along ejector mechanism 350 between first core end 357 and second core end 359 and/or anywhere between first guide end 351 and second guide end 353).

As shown in FIG. 9, for example, ejector mechanism 350 may include a core mechanism 60''' positioned between second actuator end 389 of actuator member 384 and an anchor 388. Core mechanism 60''' may be configured to move core 358 back to its retracted position once the application of a user input force on core 358 has been terminated. Core return component 60''' may include a core return driver 63''' that may function similarly to core return driver 63 of core return component 60 for returning core 358 of ejector mechanism 350 back to an original position once a user input force is terminated.

For example, core return driver 63''' may be a spring or any other suitable element that may be compressed or otherwise deformed by the application of an outward return force in the direction of arrow S''' by second actuator end 389 or any other portion of actuator 382 or core 358 on core return driver 63''' when a user input force is applied to second core end 359 in the direction of arrow U3. Core return component 60''' may be configured such that, once the application of a user input force on second core end 359 of core 358 in the direction of arrow U3 has been terminated and, thus, once the application of an outward return force on core return driver 63''' in the direction of arrow S''' has been terminated, core return driver 63''' may be biased to exert an inward return force in the direction of arrow G''' onto second actuator end 389. This inward return force may cause second actuator end 389 to move about pivot 385 in the direction of arrow F3 for applying a force onto second core component 355*b* for moving core 358 back to its retracted position.

This force in the direction of arrow F3 may cause actuator member 384 to move about pivot 385 such that an actuator force may be applied to first actuator end 387 of actuator member 384 in the direction of arrow F4. This actuator force in the direction of arrow F4 may be applied by first actuator end 387 of actuator member 384 onto first core component 355*a* (e.g., for moving first core end 357 of core component 355*a* with a retraction force in the direction of arrow R3). Ejector mechanism 350 may be configured such that, when a retraction force is applied by first core end 357 of first core component 355*a* in the direction of arrow R3 (e.g., as a pushing force), core component 355*a* may apply an actuator force to first actuator end 387' of actuator member 384' in the direction of arrow F3'. This force in the direction of arrow F3' may cause actuator member 384' to move about pivot 385' such that an actuator force may be applied to second actuator end 389' of actuator member 384' in the direction of arrow F4'. Any one or more of ejector mechanisms 50, 50', 50'', and 50''' may be configured similarly to ejector mechanism 350.

Ejectable component assembly 16 of device 10 may be provided with an ejector mechanism that may receive a user input force at an ejector user interface, translate that user input force into an ejection force, and apply that ejection force onto tray 20 for at least partially ejecting tray 20 from connector 40. The ejector user interface may be provided at any suitable position of housing 18 that may not interfere with other functions of device 10. The path along which the ejector mechanism translates the user input force into the ejection force between the ejector user interface and tray 20 may be provided in any suitable way throughout device 10. The path may be flexible, rigid, or flexible at some portions and rigid at other portions. A core and guide may extend along an interior surface or surfaces of housing 18 so as not to interfere with other components of device 10. For example, as shown in FIGS. 3, 4B, 4C, 5, 6B, and 6C, a portion of ejector mechanism 50'' may extend along an interior surface of bottom wall 18*b* of housing 18, while another portion of ejector mechanism 50'' may extend along an interior surface of left wall 18*l* of housing 18. Alternatively, portions of an ejector mechanism may be routed through or against specific components of device 10 to achieve additional functions. For example, as shown in FIGS. 2, 3, 4, 5, and 6, at least a portion of ejector mechanism 50 may be routed against a top surface of a component 90 of device 10 (e.g., a battery of device 10). In some embodiments, a portion of an ejector mechanism may be positioned adjacent a component of device 10 that generates heat (e.g., a battery, an input component, or an output component), such that that portion of the ejector mechanism may dissipate some of the generated heat. For example, as mentioned, a portion of the core of the ejector mechanism may be a fluid, such as a cooling fluid that may dissipate heat from a component adjacent to the ejector mechanism. In other embodiments, such a fluid may be contained within a portion of a guide of an ejector mechanism but may not form any portion of the core within the guide. Alternatively, as mentioned with respect to ejector mechanism 50', an ejector mechanism may share apparatus with another component of device 10 (e.g., an opening through housing 18 may be shared by a user interface of an ejector mechanism of device 10 and by a speaker and/or microphone of device 10).

It is to be understood that any portion of any core of an ejector mechanism may be provided as an independent element of the ejector mechanism or may be provided as a single unitary element along with any portion of the guide of the ejector mechanism. Therefore, in some embodiments, an ejector mechanism may be provided with a single element that may function as a core and guide of the ejector mechanism.

Figure 10:
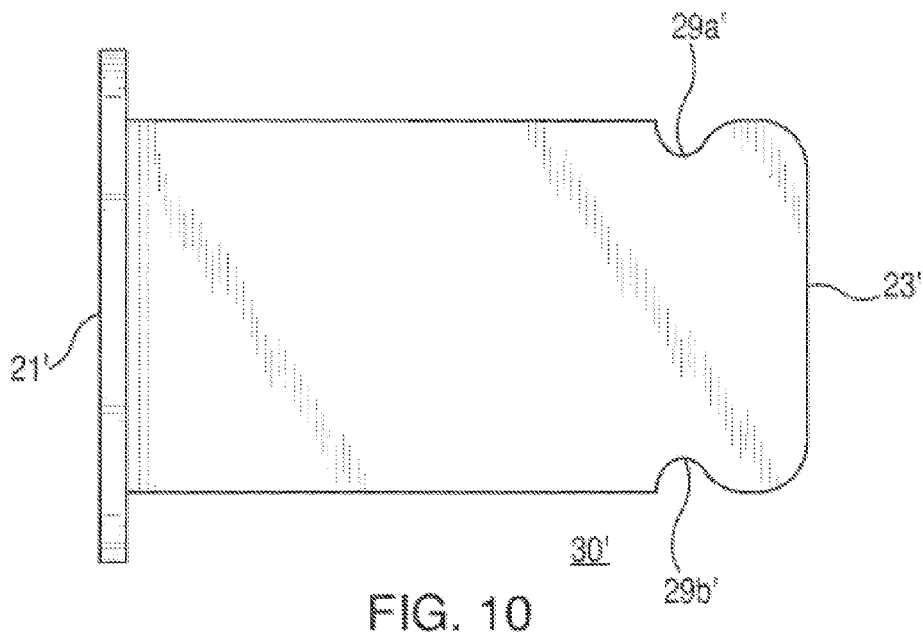
FIG. 10 is an elevational view of an alternative embodiment of a removable module for an ejectable component assembly, in accordance with some embodiments of the invention.

It is to be understood that, although ejectable component assembly 16 has been described as including a connector 40 and a tray 20 for loading a removable module 30 within connector 40, tray 20 may be unnecessary and any removable module to be inserted into connector 40 may be shaped with some or all of the features of tray 20. For example, as shown in FIG. 10, a removable module 30' can be provided that may be substantially the same as removable module 30, but that also can include first end 21' shaped similarly to first tray end 21 of tray 20, second end 23' shaped similarly to second end 23 of tray 20, and grooves 29*a*' and 29*b*' shaped similarly to grooves 29*a* and 29*b* of tray 20, such that module 30' may be inserted into and ejected from connector 40 in the same way that tray 20 may be inserted into and ejected from connector 40.

While there have been described systems and methods for ejecting removable modules from electronic devices, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms such as "up and "down," "front" and "back," "top" and "bottom," "left" and "right," "length" and "width," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Moreover, an electronic device constructed in accordance with the principles of the invention may be of any suitable three-dimensional shape, including, but not limited to, a sphere, cone, octahedron, or combination thereof, rather than a hexahedron, as illustrated by FIGS. 1-10.

Therefore, those skilled in the art will appreciate that the invention can be practiced by other than the described embodiments, which are presented for purposes of illustration rather than of limitation.

The invention claimed is:

1. An ejector mechanism for ejecting a removable entity from a connector comprising:
   a core comprising:
      a first core portion;
      a second core portion; and
      a third core portion; and
   a component that regulates at least a portion of a path within which the third core portion moves, wherein the ejector mechanism:
      receives a linear first force at the first core portion; and
      translates the first force into a second force at the second core portion via the third core portion for ejecting the removable entity from the connector, and wherein the direction of the first force is one of the following with respect to the direction of the second force:
         angled within the same plane but neither co-linear nor parallel; and
         neither parallel nor intersecting.

2. The ejector mechanism of claim 1, wherein the direction of the first force is the following with respect to the direction of the second force:
   angled within the same plane but neither co-linear nor parallel.

3. The ejector mechanism of claim 1, wherein the direction of the first force is the following with respect to the direction of the second force:
   neither parallel nor intersecting.

4. The ejector mechanism of claim 1, wherein the first core portion comprises a first end of the core.

5. The ejector mechanism of claim 4, wherein the second core portion comprises a second end of the core that is opposite the first end of the core.

6. The ejector mechanism of claim 1, wherein the first force is received from a user of the ejector mechanism.

7. The ejector mechanism of claim 1, wherein at least a portion of the core is flexible.

8. The ejector mechanism of claim 1, wherein at least a portion of the core is at least one of twisted ribbon and woven string.

9. The ejector mechanism of claim 1, wherein the core is unitary.

10. The ejector mechanism of claim 1, wherein the ejector mechanism applies the second force onto the removable entity.

11. An ejector mechanism for ejecting a removable entity from a connector comprising:
   a core comprising:
      a first core portion;
      a second core portion; and
      a third core portion; and
   a component, wherein:
      the first core portion receives a first force;
      the third core portion moves along and within a portion of the component from a first core position to a second core position in response to the received first force;
      the second core portion applies a second force onto the removable entity in response to the movement of the third core portion from the first core position to the second core position; and
      the direction of the first force is one of the following with respect to the direction of the second force:
         angled within the same plane but neither co-linear nor parallel; and
         neither parallel nor intersecting.

12. The ejector mechanism of claim 11, wherein the direction of the first force is the following with respect to the direction of the second force:
   angled within the same plane but neither co-linear nor parallel.

13. The ejector mechanism of claim 11, wherein the direction of the first force is the following with respect to the direction of the second force:
   neither parallel nor intersecting.

14. The ejector mechanism of claim 11, wherein:
   the first core portion comprises a first end of the core; and
   the second core portion comprises a second end of the core that is opposite the first end of the core.

15. The ejector mechanism of claim 11, wherein the first force is received from a user of the ejector mechanism.

16. The ejector mechanism of claim 11, wherein at least a portion of the core is at least one of:
   flexible;
   twisted ribbon; and
   woven string.

17. An electronic device comprising:
   a housing comprising:
      a first housing wall; and
      a second housing wall;
   a removable entity at least partially positioned within the housing; and
   an ejector assembly comprising:
      a first ejector portion;
      a second ejector portion; and
      a third ejector portion between the first ejector portion and the second ejector portion, wherein:
         the first ejector portion receives a first force through an interface at the first housing wall and into a space within the housing;
         the second ejector portion applies a second force onto the removable entity for at least partially ejecting the removable entity through an opening at the second housing wall in response to the received first force; and
         the first wall is adjacent to the second wall.

18. The electronic device of claim 17, wherein the direction of the first force is one of the following with respect to the direction of the second force:
   angled within the same plane but neither co-linear nor parallel; and
   neither parallel nor intersecting.

19. The electronic device of claim 17, wherein:
   the interface comprises:
      an opening through the first housing wall; and a deformable cover that covers at least a portion of the opening through the first housing wall; and the deformable cover is coupled to the first ejector portion;

the deformable cover applies a third force onto the first ejector portion; and the direction of the third force is opposite the direction of the first force.

20. The electronic device of claim 17, wherein the direction of the first force forms an angle with the outer surface of the first housing wall that is less than 90°.

* * * * *